(12) United States Patent
Seo et al.

(10) Patent No.: US 11,431,933 B2
(45) Date of Patent: Aug. 30, 2022

(54) DIGITAL PIXEL AND IMAGE SENSOR INCLUDING THE SAME

(71) Applicant: SAMSUNG ELECTRONICS CO., LTD., Suwon-si (KR)

(72) Inventors: Min Woong Seo, Hwaseong-si (KR); Myung Lae Chu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 104 days.

(21) Appl. No.: 16/844,192

(22) Filed: Apr. 9, 2020

(65) Prior Publication Data

US 2020/0412995 A1 Dec. 31, 2020

(30) Foreign Application Priority Data

Jun. 28, 2019 (KR) .................. 10-2019-0078256

(51) Int. Cl.
*H04N 5/3745* (2011.01)
*H01L 27/146* (2006.01)
(Continued)

(52) U.S. Cl.
CPC ..... *H04N 5/37452* (2013.01); *H01L 27/1463* (2013.01); *H01L 27/14603* (2013.01);
(Continued)

(58) Field of Classification Search
CPC .... H04N 5/37452; H04N 5/359; H04N 5/351; H04N 5/37455; H04N 5/378;
(Continued)

(56) References Cited

U.S. PATENT DOCUMENTS

| | | | |
|---|---|---|---|
| 8,537,241 B2 | 9/2013 | Ayers et al. | |
| 2016/0111461 A1* | 4/2016 | Ahn | H01L 27/1464 250/208.1 |

(Continued)

FOREIGN PATENT DOCUMENTS

| | | |
|---|---|---|
| JP | 2008-535397 | 8/2008 |
| JP | 2014-103133 | 6/2014 |

(Continued)

*Primary Examiner* — Albert H Cutler
(74) *Attorney, Agent, or Firm* — F. Chau & Associates, LLC

(57) ABSTRACT

A digital pixel includes a photo diode connected to a first node and configured to generate an optical signal from an incident light, a storage diode configured to store the optical signal in a second node, a floating diffusion node configured to output a detection signal based on the optical signal, a first transmission transistor connected between the first and second nodes, and configured to transmit the optical signal from the first node to the second node, a second transmission transistor connected between the second node and the floating diffusion node, and configured to transmit the optical signal from the second node to the floating diffusion node, and a discharge transistor connected to the first node and configured to be turned on in a section in which the second transmission transistor is turned on to discharge a parasitic charge generated in the first node.

19 Claims, 19 Drawing Sheets

(51) Int. Cl.
*H04N 5/351* (2011.01)
*H04N 5/359* (2011.01)
*H04N 5/378* (2011.01)
*H04N 5/369* (2011.01)
*H04N 5/357* (2011.01)

(52) U.S. Cl.
CPC .. *H01L 27/14612* (2013.01); *H01L 27/14643* (2013.01); *H04N 5/351* (2013.01); *H04N 5/359* (2013.01)

(58) Field of Classification Search
CPC ...... H04N 5/369; H04N 5/357; H04N 5/3745; H01L 27/14603; H01L 27/14612; H01L 27/1463; H01L 27/14643; H01L 27/1464; H01L 27/14623
See application file for complete search history.

(56) References Cited

U.S. PATENT DOCUMENTS

| | | |
|---|---|---|
| 2016/0148960 A1 | 5/2016 | Egawa |
| 2017/0094202 A1* | 3/2017 | Kobayashi ........ H01L 27/14612 |
| 2018/0114806 A1* | 4/2018 | Kim .................. H01L 27/14603 |
| 2018/0270438 A1 | 9/2018 | Niwa et al. |
| 2019/0081100 A1* | 3/2019 | Matsumoto ....... H01L 27/14643 |
| 2019/0089918 A1 | 3/2019 | Ayers et al. |
| 2019/0349547 A1* | 11/2019 | Velichko ........... H01L 27/14645 |
| 2020/0066767 A1* | 2/2020 | Leung ............... H01L 27/14603 |
| 2020/0092510 A1* | 3/2020 | Kashiwagi ......... H04N 5/37457 |
| 2020/0204749 A1* | 6/2020 | Mori ................. H01L 27/14612 |

FOREIGN PATENT DOCUMENTS

| | | |
|---|---|---|
| JP | 5713266 | 3/2015 |
| JP | 2016-219589 | 12/2016 |
| KR | 10-2017-0104824 | 9/2017 |

* cited by examiner

DIGITAL PIXEL AND IMAGE SENSOR INCLUDING THE SAME

CROSS REFERENCE TO RELATED APPLICATION

This application claims priority under 35 U.S.C. § 119 to Korean Patent Application No. 10-2019-0078256, filed on Jun. 28, 2019 in the Korean Intellectual Property Office, the disclosure of which is incorporated by reference herein in its entirety.

TECHNICAL FIELD

Exemplary embodiments of the inventive concept relate to a digital pixel and an image sensor including the same.

DISCUSSION OF RELATED ART

An image sensor may convert an optical image into an electric signal. In recent years, due to development in the computer and communication industries, demand has increased for image sensors with enhanced performances in a variety of fields such as digital cameras, camcorders, personal communication systems (PCS), gaming devices, security cameras, medical micro cameras, and so on.

A related-art or conventional image sensor operates based on analog pixels. Analog signals may be outputted from the analog pixels according to incident light and converted into image data. However, since the above-described analog signals are vulnerable to noises or coupling in comparison to digital signals, the conventional image sensor has a problem when processing high-resolution image signals.

SUMMARY

According to an exemplary embodiment of the inventive concept, a digital pixel includes a photo diode connected to a first node and configured to generate an optical signal from an incident light, a storage diode configured to store the optical signal in a second node, a floating diffusion node configured to output a detection signal based on the optical signal, a first transmission transistor connected between the first and second nodes, and configured to transmit the optical signal from the first node to the second node, a second transmission transistor connected between the second node and the floating diffusion node, and configured to transmit the optical signal from the second node to the floating diffusion node, and a discharge transistor connected to the first node and configured to be turned on in a section in which the second transmission transistor is turned on to discharge a parasitic charge generated in the first node.

According to an exemplary embodiment of the inventive concept, a digital pixel includes an optical signal generator configured to generate a first optical signal from an incident light in a first section, an optical signal storage configured to receive the first optical signal from the optical signal generator and to store the first optical signal in a second section, a detection signal outputter configured to receive the first optical signal from the optical signal storage, and to output a detection signal based on the first optical signal in a third section, and a discharger configured to discharge a second optical signal generated from the optical signal generator in the third section.

According to an exemplary embodiment of the inventive concept, an image sensor includes a digital pixel array configured to sense an optical signal from an outside, and including a plurality of digital pixels each configured to output a digital pixel signal based on the optical signal, a pixel driver configured to output a control signal for controlling the digital pixel array, and a digital logic circuit configured to perform digital signal processing with respect to the digital pixel signal received from each of the plurality of digital pixels of the digital pixel array. Each of the plurality of digital pixels includes an optical signal generator configured to generate a first optical signal from an incident light in a first section, an optical signal storage configured to receive the first optical signal from the optical signal generator and to store the first optical signal in a second section, a detection signal outputter configured to receive the first optical signal from the optical signal storage, and to output a detection signal based on the first optical signal in a third section, and a discharger configured to discharge a second optical signal generated from the optical signal generator in the third section.

BRIEF DESCRIPTION OF THE DRAWINGS

The above and other objects and features of the inventive concept will become more apparent by describing in detail exemplary embodiments thereof with reference to the accompanying drawings.

DETAILED DESCRIPTION OF THE EMBODIMENTS

Figure 1:
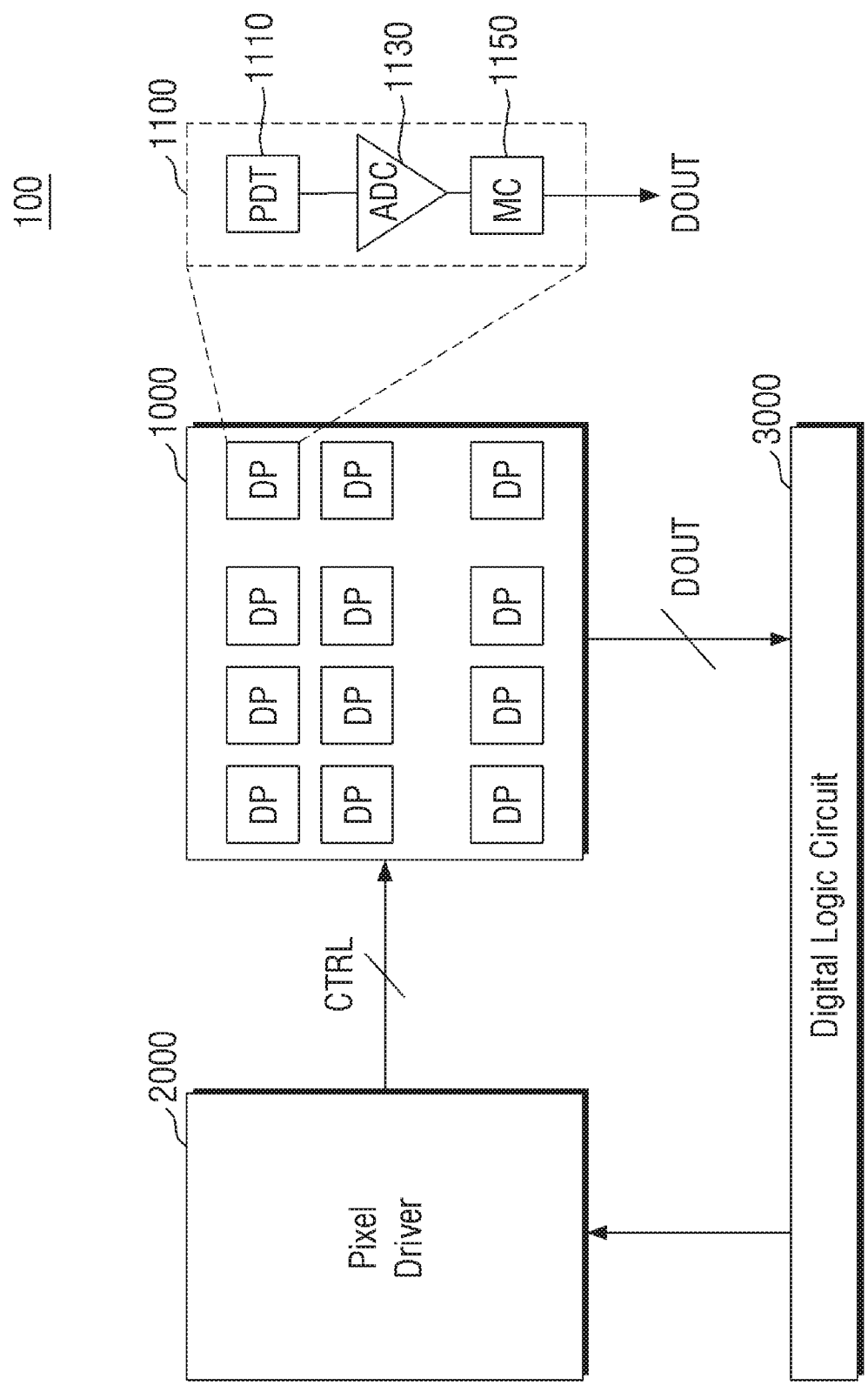
FIG. 1 is a view provided to explain an image sensor according to an exemplary embodiment of the inventive concept.

Exemplary embodiments of the inventive concept provide a digital pixel and an image sensor including the same which have enhanced operating properties by preventing a parasitic charge from being transmitted to a storage node in a section in which an optical signal is transmitted to a floating diffusion node.

Exemplary embodiments of the inventive concept will be described more fully hereinafter with reference to the accompanying drawings. Like reference numerals may refer to like elements throughout this application.

Figure 2:
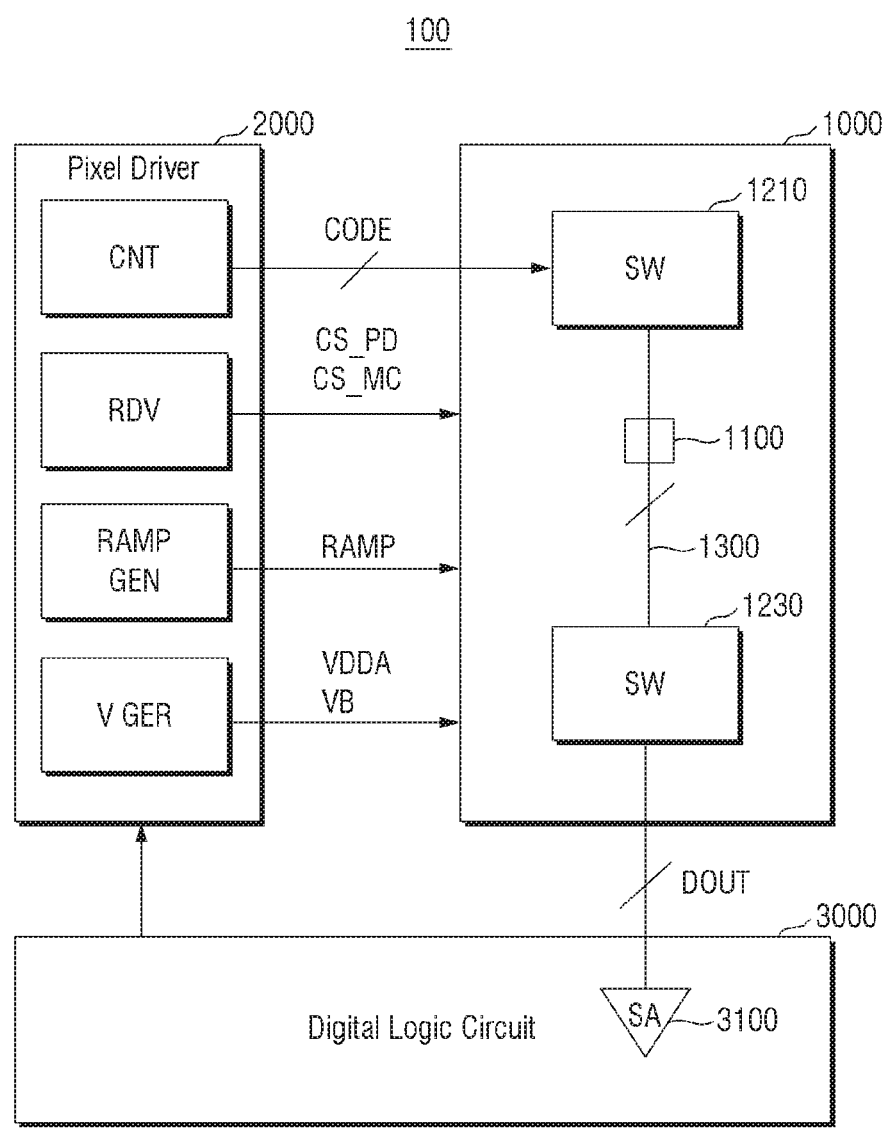
FIG. 2 is a view provided to explain the image sensor of FIG. 1 in detail according to an exemplary embodiment of the inventive concept.

FIG. 1 is a view provided to explain an image sensor according to an exemplary embodiment of the inventive concept, and FIG. 2 is a view provided to explain the image sensor of FIG. 1 in detail according to an exemplary embodiment of the inventive concept.

Referring to FIG. 1, an image sensor 100 according to an exemplary embodiment of the inventive concept may include a digital pixel array 1000, a pixel driver 2000, and a digital logic circuit 3000.

The digital pixel array 1000 may include digital pixels (DP) 1100, each of which senses an optical signal from the outside, stores data corresponding to the sensed optical signal, and outputs a digital pixel signal DOUT digitally converted based on the sensed optical signal. The digital pixel 1100 may include an optical signal detector (photo detector) PDT 1110, an analog-to-digital converted ADC 1130, and memory cells (memory circuit) MC 1150.

The optical signal detector PDT 1110 may detect the optical signal sensed from the outside and output a detection signal DET. The analog-to-digital converter ADC 1130 may convert the detection signal DET (an analog signal) detected by the optical signal detector 1110 into a digital signal, and output the digital pixel signal DOUT. In the present disclosure, the analog-to-digital converter 1130 may be referred to as a comparison circuit 1130. The memory cells MC 1150 may store the digital pixel signal DOUT corresponding to the detection signal DET. The memory cells MC 1150 may output the stored digital pixel signal DOUT to the digital logic circuit 3000.

The pixel driver 2000 may output a control signal CTRL for controlling the digital pixel array 1000 based on control of the digital logic circuit 3000.

The digital logic circuit 3000 may perform digital signal processing with respect to the digital pixel signal DOUT received from the digital pixel array 1000 and provide a final image to an external device (for example, an image signal processor (ISP), an application processor (AP), etc.).

Unlike a conventional analog pixel, each of the digital pixels 1100 may store data corresponding to the detection signal DET detected by the optical signal detector 1110, e.g., the digital pixel signal DOUT, at a pixel level. Accordingly, an area, a time, and power consumption that are required to store data in the digital pixel 1100, read out stored data, or process the read-out data can be enhanced.

Referring to FIG. 2, the pixel driver 2000 may include a counter CNT, a row driver RDV, a ramp generator RAMP GEN, and a voltage generator V GER. The row driver RDV may select the digital pixels 1100 on a row-by-row basis. The row driver RDV may output an optical signal detector control signal CS_PD and a memory control signal CS_MC.

The counter CNT may initiate a counting operation with respect to the digital pixel signal DOUT based on a change of a voltage level VRAMP of a ramp signal RAMP, under control of the digital logic circuit 3000. When the voltage level VRAMP of the ramp signal RAMP starts to be changed, the counter CNT may increase or reduce a value (e.g., a counting value) of a code CODE serially in every period of a clock signal. The value of the code CODE may change serially with time. The value of the code CODE may be in proportion to the voltage level VRAMP of the ramp signal RAMP.

The ramp generator RAMP GEN may output the ramp signal RAMP which is a signal decreasing or increasing constantly (for example, an increasing/decreasing signal having a constant slope) based on control of the digital logic circuit 3000. The ramp signal RAMP may be referred to as a reference signal since it is compared with the detection signal DET detected by the optical signal detector 1110. For example, the ramp generator RAMP GEN may be implemented by using an integrator.

The voltage generator V GER may generate various voltages for operating the image sensor 100. The voltage generator V GER may supply analog voltages (for example, a power voltage VDDA, a bias voltage VB, etc.) to circuits processing analog signals in the digital pixels 1100, and supply digital voltages to circuits processing digital signals in the digital pixels 1100. The optical signal detector control signal CS_PD, the memory control signal CS_MC, the code CODE, and the ramp signal RAMP of FIG. 2 may be included in the control signal CTRL described with reference to FIG. 1.

According to an exemplary embodiment of the inventive concept, a size of the code CODE may be N-bit and the number of a plurality of transmission lines 1300 may be N. Accordingly, one bit may be transmitted per one transmission line. The digital pixel 1100 may receive the code CODE from the counter CNT through a first switch 1210 and the plurality of transmission lines 1300. The digital pixel 1100 may latch and store a reset counting value and a signal counting value corresponding to a reset level and a signal level, respectively, of the detection signal DET detected by the optical signal detector 1110, based on the code CODE. The reset counting value and the signal counting value may be used in correlated double sampling (CDS) performed by the digital logic circuit 3000. The digital pixel 1100 may output, as the digital pixel signal DOUT, the reset counting value and the signal counting value to the digital logic circuit 3000 through the plurality of transmission lines 1300 and a second switch 1230. The plurality of transmission lines 1300 may be arranged in a row direction and may extend in a column direction. The plurality of transmission lines 1300 may be shared by one or more digital pixels 1100 connected to the plurality of transmission lines 1300.

The first switch 1210 may electrically connect the counter CNT and the plurality of transmission lines 1300 to transmit the code CODE to the digital pixel 1100. The second switch 1230 may electrically connect the plurality of transmission lines 1300 and a sensing amplifier SA 3100 of the digital logic circuit 3000 to transmit the reset counting value and the signal counting value stored in the digital pixel 1100 to the sensing amplifier SA 3100. Although it is illustrated in FIG. 2 that the first switch 1210 is included in the digital pixel array 1000, the first switch 1210 may be implemented in a different position of the image sensor 100.

When the first switch 1210 electrically connects the counter CNT and the plurality of transmission lines 1300, the second switch 1230 may not electrically connect the sensing amplifier 3100 and the plurality of transmission lines 1300. To the contrary, when the second switch 1230 electrically connects the sensing amplifier 3100 and the plurality of transmission lines 1300, the first switch 1210 may be turned off, and may not electrically connect the counter CNT and the plurality of transmission lines 1300.

The first and second switches 1210 and 1230 may reduce the number of transmission lines which are used to transmit the code CODE to the digital pixel 1100, and to read out the reset counting value and the signal counting value from the digital pixel 1100.

The sensing amplifier 3100 may sense and amplify the digital pixel signal DOUT transmitted through the plurality of transmission lines 1300. The plurality of transmission lines 1300 illustrated in FIG. 2 may correspond to one group, the digital pixel array 1000 may have a plurality of groups of transmission lines arranged therein, and one or more sensing amplifiers 3100 may be implemented according to the number of the plurality of transmission lines 1300.

Figure 3:
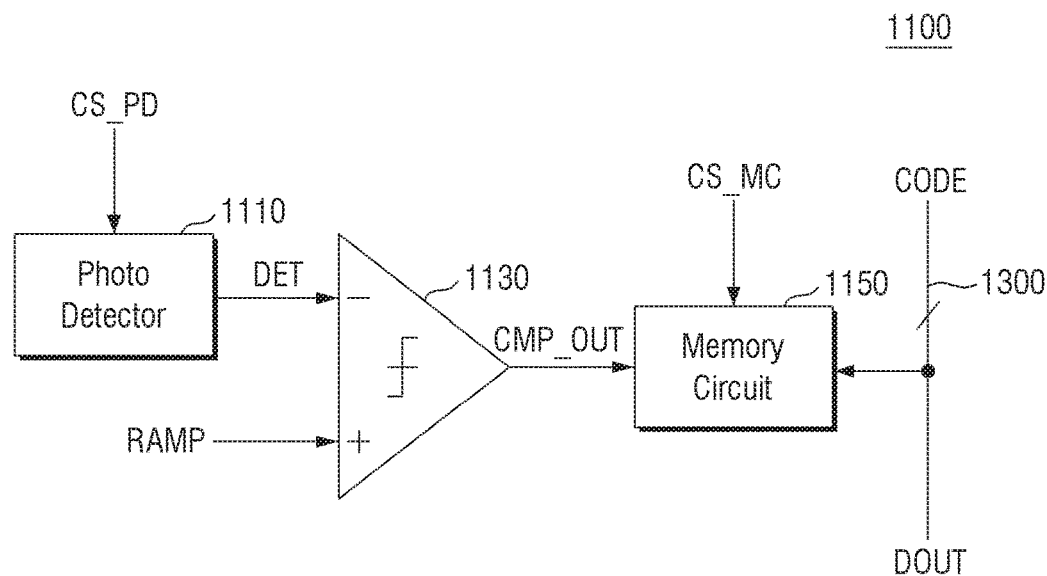
FIG. 3 is a view provided to explain a digital pixel of FIG. 2 according to an exemplary embodiment of the inventive concept.

FIG. 3 is a view provided to explain a digital pixel of FIG. 2 according to an exemplary embodiment of the inventive concept.

Referring to FIG. 3, the digital pixel 1100 may operate in response to signals (for example, CS_PD) outputted from the pixel driver 2000. The digital pixel 1100 may include the optical signal detector 1110, the comparison circuit 1130, and the memory circuit 1150. The comparison circuit 1130 and the memory circuit 1150 of FIG. 3 may correspond to the ADC 1130 and the memory cells 1150 of FIG. 1, respectively.

The optical signal detector 1110 may detect an optical signal entering from the outside and generate the detection signal DET corresponding to the detected optical signal. The detection signal DET may be an analog signal.

The comparison circuit 1130 may be a one-bit ADC or a differential amplifier, and compare the detection signal DET and the ramp signal RAMP. The comparison circuit 1130 may be referred to as a single-slope ADC. The comparison circuit 1130 may be an amplifier that receives the detection signal DET through a negative (−) input terminal and receives the ramp signal RAMP through a positive (+) input terminal. However, the polarities of the input terminals are merely examples. The voltage level VRAMP of the ramp signal RAMP may decrease or increase at a predetermined slope (linearly) during a predetermined time. When the voltage level VRAMP of the ramp signal RAMP reaches a voltage level VFD of the detection signal DET (when the voltage level VRAMP is lower or higher than the voltage level VFD), the comparison circuit 1130 may change a logic state (or phase) of a comparison signal CMP_OUT. When the voltage level VRAMP reaches a reset level and a signal level of the detection signal DET, the comparison circuit 1130 may change the logic state of the comparison signal CMP_OUT, such that the memory circuit 1150 latches a reset counting value and a signal counting value corresponding to the reset level and the signal level, respectively, of the detection signal DET. The operation of the comparison circuit 1130 will be described below with reference to FIG. 18.

The memory circuit 1150 may store the code CODE corresponding to the detection signal DET in response to the comparison signal CMP_OUT and the memory control signal CS_MC. The memory circuit 1150 may output the reset counting value and the signal counting value as the digital pixel signal DOUT in response to the memory control signal CS_MC.

Figure 4:
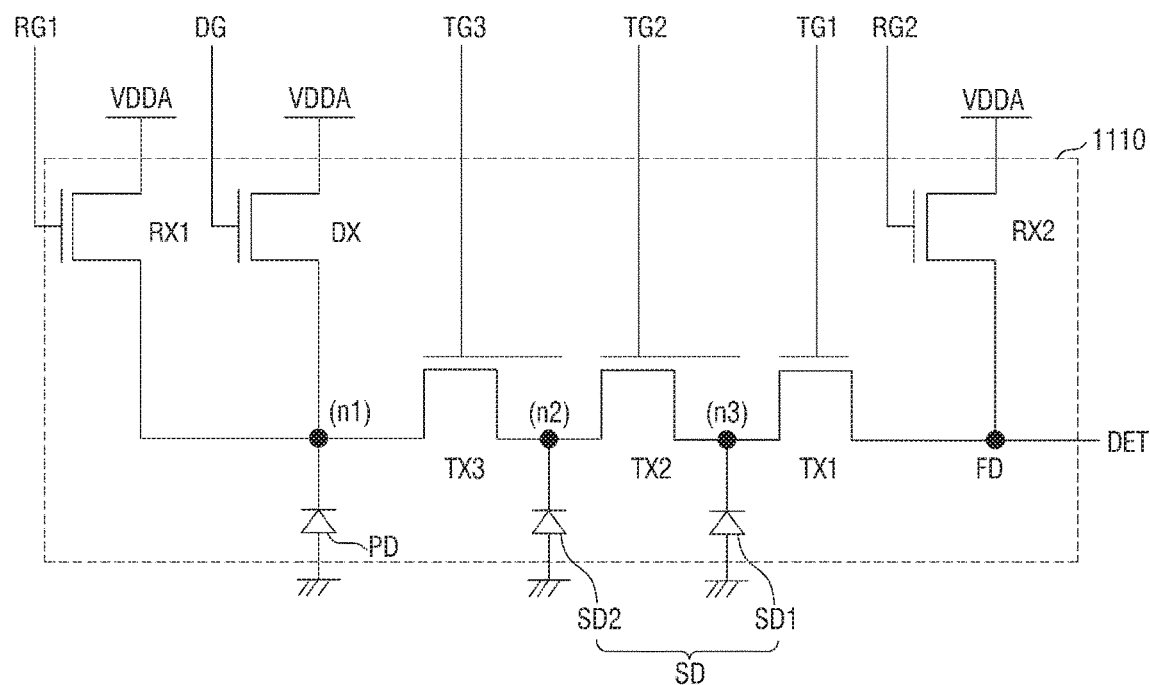
FIG. 4 is a circuit diagram provided to explain an optical signal detector included in the digital pixel of FIG. 3 according to an exemplary embodiment of the inventive concept.

FIG. 4 is a circuit diagram provided to explain an optical signal detector included in the digital pixel of FIG. 3 according to an exemplary embodiment of the inventive concept.

Referring to FIG. 4, the optical signal detector 1110 may include a photo diode PD and one or more transistors TX1, TX2, TX3, RX1, RX2, and DX constituting a readout circuit.

The optical signal detector 1110 may include a photoelectric conversion element. The photoelectric conversion element may generate and accumulate electric charges in proportion to an amount of light entering from the outside. The photoelectric conversion element may convert incident light into an electric signal. For example, the photoelectric conversion element may be a photo diode (PD), a photo transistor, a photo gate, a pinned photo diode (PPD), or a combination thereof. Although FIG. 4 depicts that the photoelectric conversion element is the photo diode PD by way of an example, this should not be considered as limiting, and various types of photoelectric conversion elements may be implemented.

According to an exemplary embodiment of the inventive concept, the photo diode PD may be connected to a first node n1 between a third transmission transistor TX3 and a ground terminal, between a first reset transistor RX1 and the ground terminal, or a discharge transistor DX and the ground terminal.

The first reset transistor RX1 may be used to connect the photo diode PD to the power voltage VDDA based on a first reset signal RG1, and to remove photo charges accumulated in the photo diode PD.

A second transmission transistor TX2 and the third transmission transistor TX3 may transmit an electric charge between the photo diode PD and a storage diode SD. According to an exemplary embodiment of the inventive concept, the third transmission transistor TX3 may be connected between the first node n1 and a second node n2 to transmit an electric charge between the photo diode PD and a second region SD2 of the storage diode SD. According to an exemplary embodiment of the inventive concept, the second transmission transistor TX2 may be connected between the second node n2 and a third node n3 to transmit an electric charge between the second region SD2 and a first region SD1 of the storage diode SD. The second transmission transistor TX2 and the third transmission transistor TX3 may be turned on or turned off by a second transmission signal TG2 and a third transmission signal TG3, respectively. The third transmission transistor TX3 may be referred to as a first sub transmission transistor and the second transmission transistor TX2 may be referred to as a second sub transmission transistor.

The storage diode SD may temporarily store photo charges generated in the photo diode PD. Although FIG. 4 depicts the storage diode SD as an example of a light receiving element, the inventive concept is not limited thereto, and the light receiving element may be changed in any form. For example, the storage diode SD may be implemented by using a capacitor. According to an exemplary embodiment of the inventive concept, the storage diode SD may include the first region SD1 and the second region SD2. For example, the first region SD1 may be closer to a floating diffusion node FD than the second region SD2. According to an exemplary embodiment of the inventive concept, the photo charges accumulated in the photo diode PD may not be directly transmitted to the floating diffusion node FD and may be temporarily stored in the storage diode SD and then transmitted to the floating diffusion node FD, such that a global shutter operation of the image sensor 100 can be implemented. In other words, by accumulating information (for example, photo charges) stored in the plurality of digital pixels 1100 in the same section, and storing the same in the storage diode SD, the photo diode PD may be exposed at the same time even if an analog-to-digital converting operation is performed in different sections, and accordingly, the storage diode SD may operate as a global shutter.

A first transmission transistor TX1 may electrically connect the third node n3 and the floating diffusion node FD based on a first transmission signal TG1. The first transmission transistor TX1 may be turned on or turned off by the first transmission signal TG1. The first transmission transistor TX1 may transmit the charges accumulated in the storage diode SD to the floating diffusion node FD. The amount of the electric charges (Q) of the floating diffusion node FD transmitted through the first transmission transistor TX1 may be converted into a voltage difference (=Q/CFD) by a capacitance CFD of the floating diffusion node FD. The voltage level VFD of the detection signal DET may correspond to a voltage level of the floating diffusion node FD.

A second reset transistor RX2 may reset the floating diffusion node FD to the power voltage VDDA based on a second reset signal RG2. The second reset transistor RX2 may discharge the electric charges accumulated in the floating diffusion node FD. The second reset transistor RX2 may be turned on or turned off by the second reset signal RG2.

According to an exemplary embodiment of the inventive concept, when the second reset transistor RX2 and the first to third transmission transistors TX1, TX2, and TX3 are turned on, the electric charges of the photo diode PD may be discharged, and the photo diode PD may also be reset.

The discharge transistor DX may discharge the electric charges accumulated in the first node n1, e.g., in the photo diode PD, based on a discharge signal DG. The discharge transistor DX may be turned on or turned off by the discharge signal DG. The operation of the discharge transistor DX will be described below with reference to FIG. 8.

Figure 5:
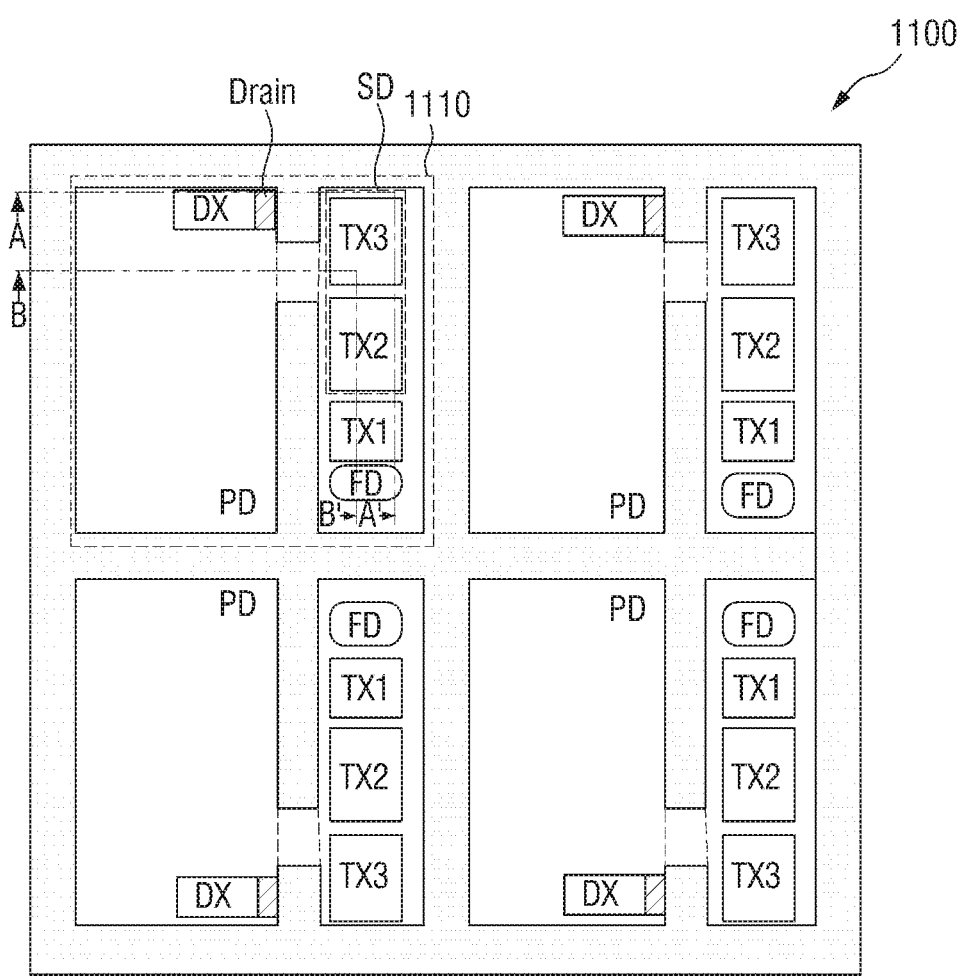
FIG. 5 is a top view provided to explain the digital pixel of FIGS. 3 and 4 according to an exemplary embodiment of the inventive concept.
Figure 6:
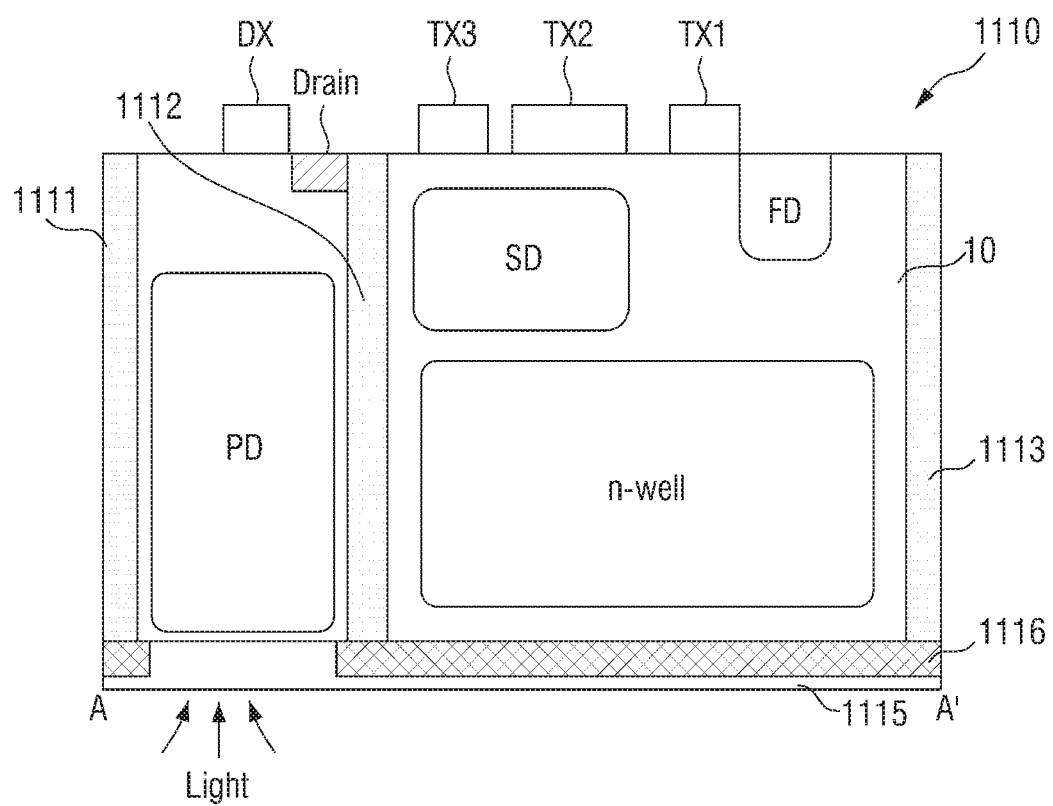
FIG. 6 is a cross-sectional view taken on line A-A' of FIG. 5 according to an exemplary embodiment of the inventive concept.
Figure 7:
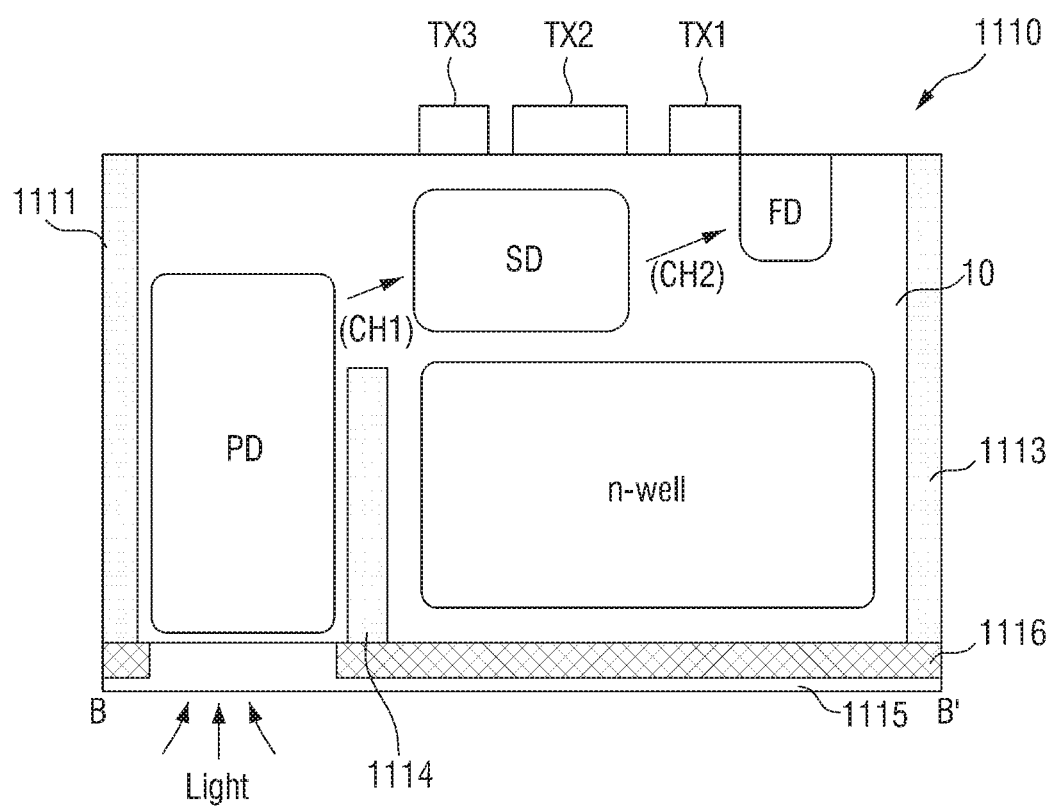
FIG. 7 is a cross-sectional view taken on line B-B' of FIG. 5 according to an exemplary embodiment of the inventive concept.

FIG. 5 is a top view provided to explain the digital pixel of FIGS. 3 and 4 according to an exemplary embodiment of the inventive concept. FIG. 6 is a cross-sectional view taken on line A-A' of FIG. 5 according to an exemplary embodiment of the inventive concept. FIG. 7 is a cross-sectional view taken on line B-B' of FIG. 5 according to an exemplary embodiment of the inventive concept. For convenience of explanation, some elements of the digital pixel 1100 explained with reference to FIG. 4 are omitted in FIGS. 5 to 7, but the digital pixel 1100 may include the omitted elements (for example, the first and second reset transistors RX1 and RX2, etc.).

Referring to FIGS. 5 to 7, the digital pixel 1100 according to an exemplary embodiment of the inventive concept may include a substrate 10, the first to third transmission transistors TX1, TX2, and TX3, the discharge transistor DX, the photo diode PD, the storage diode SD, the floating diffusion node FD, etc. The discharge transistor DX, the photo diode PD, the storage diode SD, and the floating diffusion node FD may be referred to as a discharger, an optical signal generator, an optical signal storage, and a detection signal outputter, respectively.

The substrate 10 may be, for example, a bulk silicon or a silicon-on-insulator (SOI). Alternatively, the substrate 10 may be a silicon substrate, or may include other materials such as silicon germanium, indium antimonide, lead telluride compound, indium arsenide, indium phosphide, gallium arsenide, or gallium antimonide. The substrate 10 may be a base substrate having an epitaxial layer formed thereon.

The first to third transmission transistors TX1, TX2, and TX3 may include a conductive material, for example. The conductive material may be, for example, doped poly silicon, titanium nitride (TiN), tantalum nitride (TaN), tungsten nitride (WN), titanium (Ti), tantalum (Ta), or tungsten (W), although the inventive concept is not limited thereto.

The photo diode PD may be formed inside the substrate 10. The photo diode PD may be formed with a plurality of doped regions stacked one on another. In this case, a lower portion of the photo diode PD may be formed by injecting an n+ type ion, and an upper portion thereof may be formed by injecting an n− type ion. The photo diode PD may function as a light sensing element, and simultaneously, may function as a storage region to store an electric charge generated by sensing an optical signal.

The photo diode PD may be formed adjacent to a rear surface of the substrate 10. In addition, at least a part of the rear surface of the substrate 10 may be covered by a shielding film 1116 formed within a planarization film 1115, but the rear surface of the substrate 10 overlapping the photo diode PD may be exposed by the shielding film 1116. This is to transmit light collected from a lens to the photo diode PD.

The storage diode SD may be formed inside the substrate 10. The storage diode SD may be formed with a plurality of doped regions stacked one on another. In this case, a lower portion of the storage diode SD may be formed by injecting an n+ type ion, and an upper portion thereof may be formed by injecting an n− type ion.

The second and third transmission transistors TX2 and TX3 may transmit electric charges stored in the photo diode PD to the storage diode SD. For example, the third transmission transistor TX3 may be turned on by the third transmission signal TG3 to connect the photo diode PD and the second region SD2 of the storage diode SD. In other words, the photo diode PD may function as a source of the third transmission transistor TX3, and the second region SD2 of the storage diode SD may function as a drain of the third transmission transistor TX3.

In addition, the second transmission transistor TX2 may be turned on by the second transmission signal TG2 to connect the second region SD2 of the storage diode SD and the first region SD1. In other words, the second region SD2 of the storage diode SD may function as a source of the second transmission transistor TX2, and the first region SD1 of the storage diode SD may function as a drain of the second transmission transistor TX2. According to an exemplary embodiment of the inventive concept, the first region SD1 of the storage diode SD may be relatively closer to the floating diffusion node FD than the second region SD2.

Although FIGS. 5 to 7 depict that the optical signal detector 1110 includes the second and third transmission transistors TX2 and TX3, this should not be considered as limiting, and one transistor may be implemented to transmit an electric charge between the photo diode PD and the storage diode SD. In another example, the design may be changed to include three or more transistors to transmit the electric charge between the photo diode PD and the storage diode SD.

The first transmission transistor TX1 may transmit the electric charge temporarily stored in the storage diode SD to the floating diffusion node FD. For example, the first transmission transistor TX1 may be turned on by the first transmission signal TG1 to connect the storage diode SD and the floating diffusion node FD.

Referring to FIG. 6, in the case of the cross-section taken on line A-A', the photo diode PD may be surrounded by a deep trench isolation (DTI) 1111 and a DTI 1112, and may not be connected with the storage diode SD. In addition, the storage diode SD may be surrounded by the DTI 1112 and a DTI 1113 and may not be connected with the photo diode PD. In other words, a channel may not be formed between the photo diode PD and the storage diode SD. The DTI 1111, the DTI 1112, and the DTI 1113 may be formed by a front-side deep trench isolation (FDTI) process.

Referring to FIG. 7, in the case of the cross-section taken on line B-B', a first channel CH1 may be formed between the photo diode PD and the storage diode SD. In other words, a DTI 1114 formed between the photo diode PD and the storage diode SD may not be extended to an upper surface of the substrate 10, and may be extended only to a part of the substrate 10 in a height direction. Accordingly, the first channel CH1 may be formed between the photo diode PD and the storage diode SD to transmit an electric charge. According to an exemplary embodiment of the inventive concept, the DTI 1114 may be formed by a back-side deep trench isolation (BDTI) process.

According to an exemplary embodiment of the inventive concept, in the optical signal detector 1110 of the digital pixel 1100, the first channel CH1 may be formed to transmit an electric charge between the photo diode PD and the storage diode SD, and a second channel CH2 may be formed to transmit an electric charge between the storage diode SD and the floating diffusion node FD.

Referring back to FIG. 5, the discharge transistor DX according to an exemplary embodiment of the inventive concept may be disposed on the substrate 10 to discharge an electric charge generated in the photo diode PD in the process of transmitting the electric charge stored in the storage diode SD to the floating diffusion node FD. The discharge transistor DX may be disposed adjacent to the first channel CH1 between the photo diode PD and the storage diode SD.

The digital pixel 1100 according to an exemplary embodiment of the inventive concept may operate to avoid transferring a parasitic charge, which is generated in the photo diode PD in the process of transmitting an optical signal to be obtained, to the storage diode SD, and to discharge the parasitic charge to a drain of the discharge transistor DX. Accordingly, the digital pixel 1100 can enhance parasitic light sensitivity (PLS) or shutter efficiency of the image sensor 100. The operation of the discharge transistor DX will be described in detail with reference to FIGS. 8 to 15B.

Figure 8:
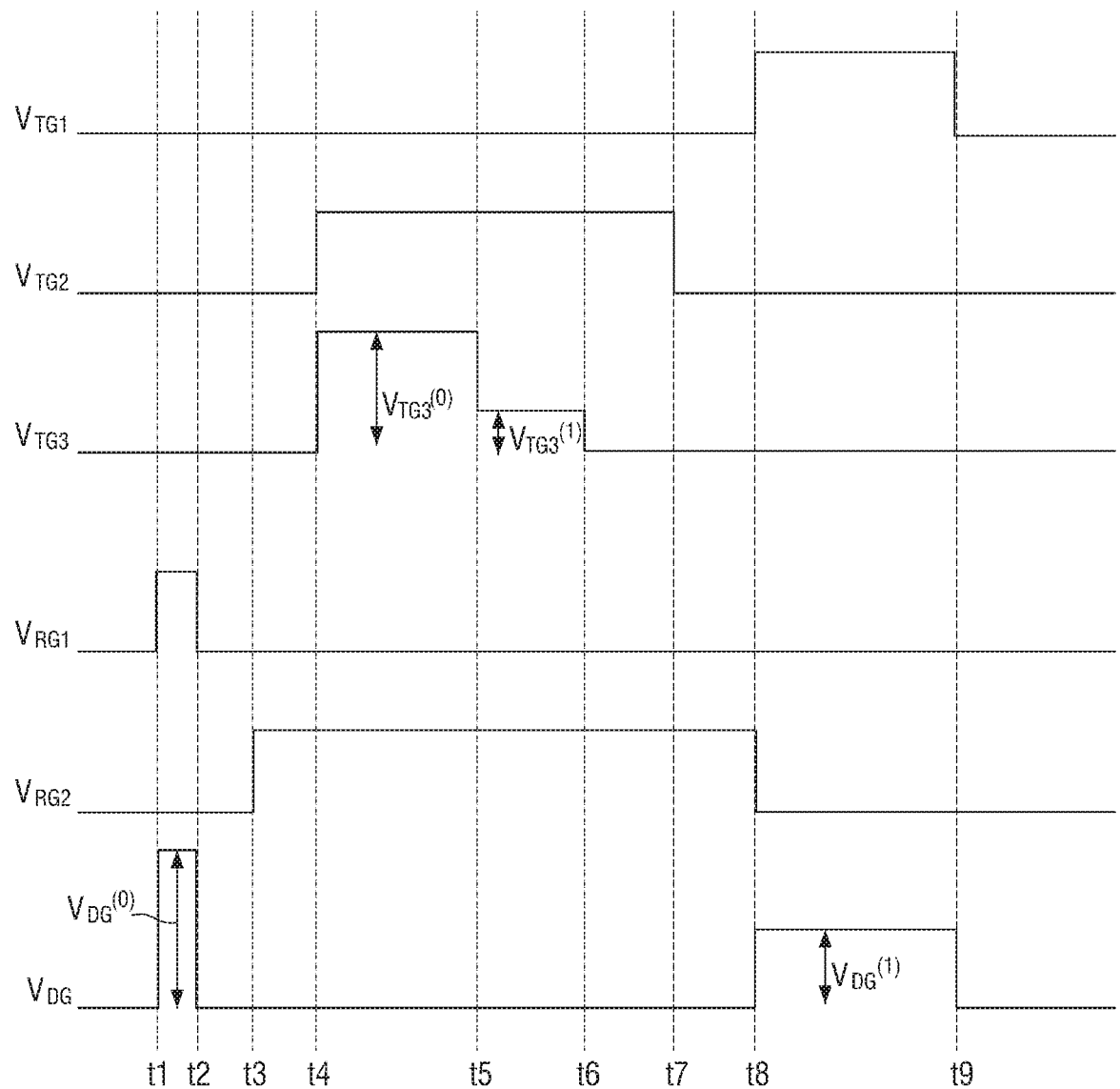
FIG. 8 is a timing chart provided to explain an operation of the optical signal detector of FIG. 4 according to an exemplary embodiment of the inventive concept.

FIG. 8 is a timing chart provided to explain an operation of the optical signal detector of FIG. 4 according to an exemplary embodiment of the inventive concept. FIGS. 9A, 10A, 11A, 12A, 13A, 14A, and 15A are top views illustrating the operation of the optical signal detector of FIG. 8 according to an exemplary embodiment of the inventive concept, and FIGS. 9B, 10B, 11B, 12B, 13B, 14B, and 15B are views illustrating movement of an electric charge to explain the operation of the optical signal detector of FIG. 8 according to an exemplary embodiment of the inventive concept. Hereinafter, a process of accumulating photo charges TC in the photo diode PD, storing the photo charges TC in the storage diode SD through the first channel CH1, and transmitting the photo charges TC to the floating diffusion node FD through the second channel CH2 will be described in detail with reference to FIGS. 8 to 15B.

Referring to FIG. 8, the first reset signal RG1 having a voltage level $V_{RG1}$ is provided to the gate of the first reset transistor RX1 at a first time t1. The first reset signal RG1 may turn on the first reset transistor RX1, and connect the photo diode PD to the power voltage VDDA to reset charges accumulated in the photo diode PD.

Next, at a second time t2, the provision of the first reset signal RG1 ends and an electric charge starts to be accumulated in the photo diode PD. In this case, voltages may not be provided to the gates of the first to third transmission transistors TX1, TX2, and TX3 and the second reset transistor RX2. In other words, they may be turned off.

According to an exemplary embodiment of the inventive concept, a discharge signal DG having a first discharge voltage level $V_{DG}(0)$ may be applied to the gate of the discharge transistor DX from the first time t1 at which the first reset transistor RX1 is turned on to a second time t2. In other words, in the reset operation of the photo diode PD, not only the first reset transistor RX1 but also the discharge transistor DX may be turned on and operated, and efficiency of the reset operation can be enhanced.

Next, electric charges may be accumulated in the photo diode PD from the second time t2 to a fourth time t4. According to an exemplary embodiment of the inventive concept, the second reset signal RG2 having a voltage level $V_{RG2}$ may be provided to the gate of the second reset transistor RX2 at a third time t3. The second reset signal RG2 may be applied to the gate of the second reset transistor RX2, and the power voltage VDDA may not be applied to a terminal of the second reset transistor RX2 that is not connected with the floating diffusion node FD. In this case, a voltage level of the floating diffusion node FD may be low, and an electric charge may be prevented from flowing over to the floating diffusion node FD when an electric charge is transmitted from the photo diode PD to the storage diode SD afterward.

Figure 9A:
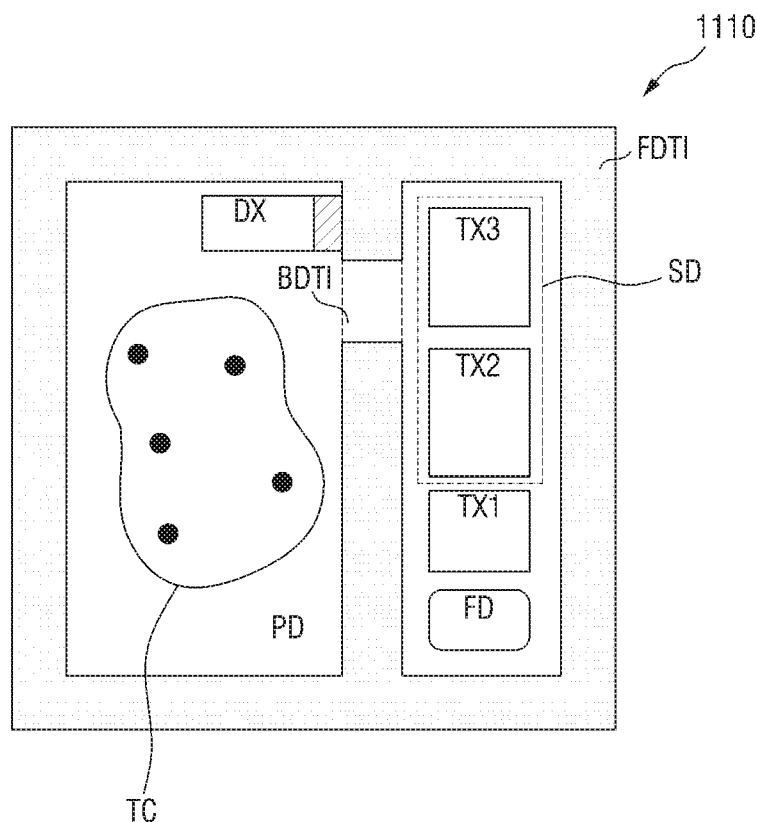
FIGS. 9A, 10A, 11A, 12A, 13A, 14A, and 15A are top views provided to explain the operation of the optical signal detector of FIG. 8 according to an exemplary embodiment of the inventive concept.
Figure 9B:
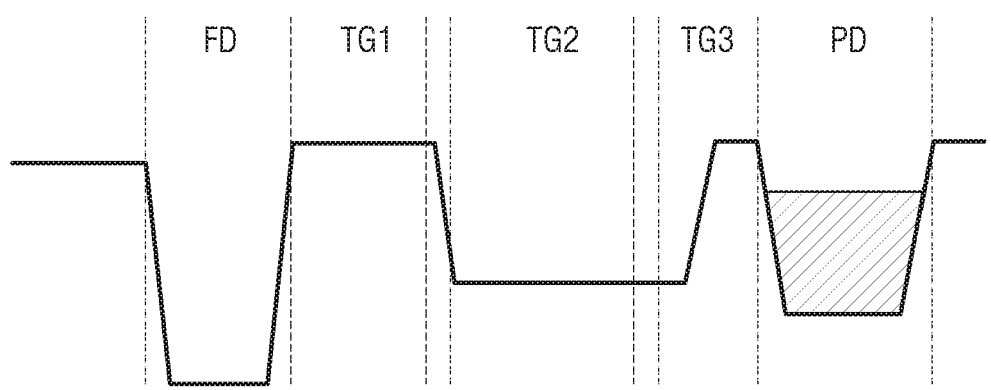
FIGS. 9B, 10B, 12B, 13B, 14B, and 15B are views illustrating movement of an electric charge to explain the operation of the optical signal detector of FIG. 8 according to an exemplary embodiment of the inventive concept.

Referring to FIG. 8 and FIGS. 9A and 9B, photo charges TC may be accumulated in the photo diode PD from the second time t2 to the fourth time t4. In FIGS. 9A to 15A, the photo charge TC may refer to a charge for an image to be obtained, and a parasitic charge PC may refer to a charge which is accumulated in the photo diode PD in the process of transmitting the photo charge TC and causes a noise in the image to be generated.

Figure 10A:
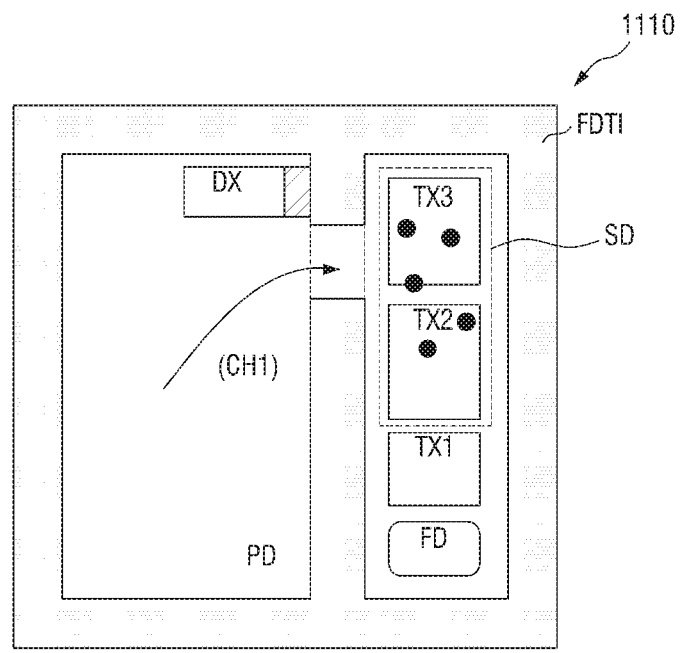
Figure 10B:
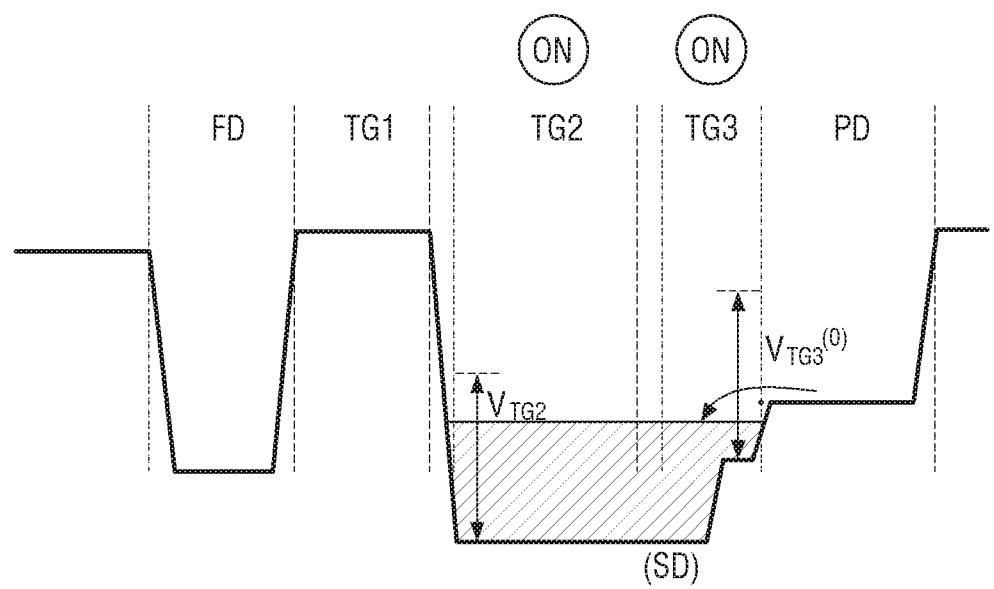

Referring to FIG. 8 and FIGS. 10A and 10B, the photo charges TC accumulated in the photo diode PD may be transmitted to the storage diode SD from the fourth time t4 to a fifth time t5. For example, the second transmission signal TG2 having a voltage level $V_{TG2}$ may be applied to the gate of the second transmission transistor TX2, and the third transmission signal TG3 having a voltage level $V_{TG3}(0)$ may be applied to the gate of the third transmission transistor TX3, such that the second and third transmission transistors TX2 and TX3 are turned on. Accordingly, the first channel CH1 may be formed between the photo diode PD and the storage diode SD, and the photo charges TC may be transmitted to the storage diode SD through the first channel CH1. FIG. 8 illustrates that the second reset transistor RX2 is turned on at the third time t3, before the photo charges TC are transmitted to the storage diode SD at the fourth time t4. However, the inventive concept is not limited thereto, and the second reset transistor RX2 may be turned on at the fourth time t4.

Figure 11A:
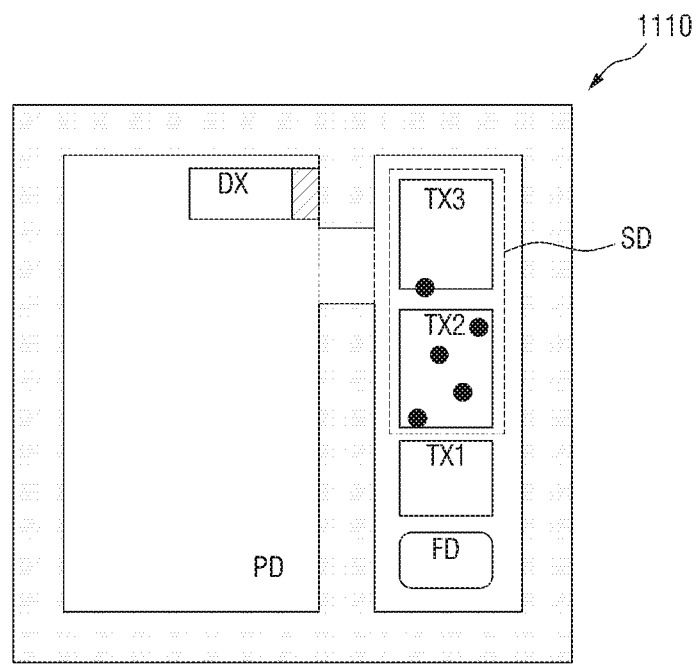
Figure 11B:
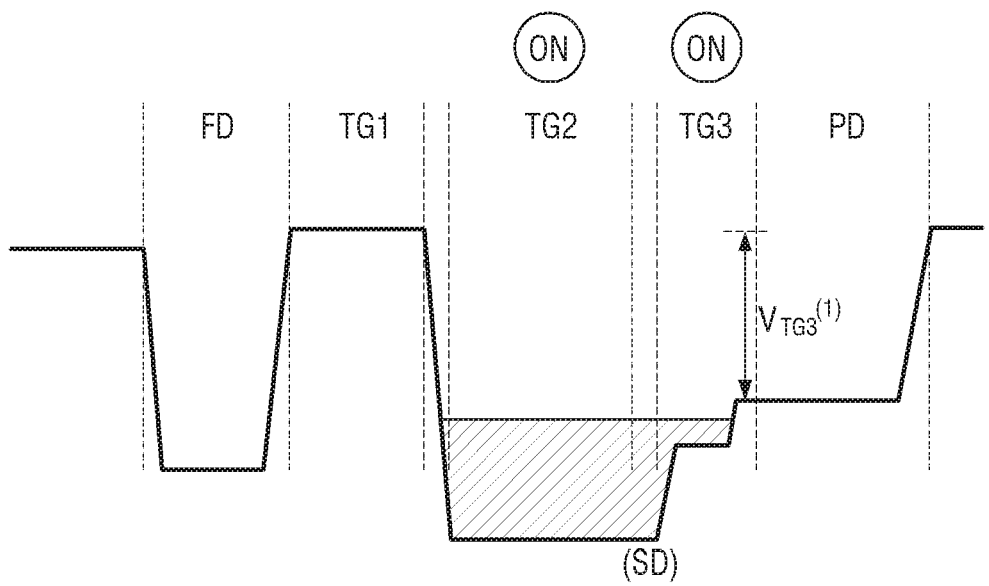

Referring to FIG. 8 and FIGS. 11A and 11B, from the fifth time t5 to a sixth time t6, the photo charges TC may be transmitted to the storage diode SD, and the third transmission signal TG3 having a voltage level $V_{TG3}(1)$ may be applied to the gate of the third transmission transistor TX3. In other words, the voltage level $V_{TG3}(1)$ lower than the voltage level $V_{TG3}(0)$ may be applied to the gate of the third transmission transistor TX3. According to an exemplary embodiment of the inventive concept, the second transmission transistor TX2 may enable transmission to the first region SD1 of the storage diode SD and control transmission to the second region SD2 of the storage diode SD by the third transmission transistor TX3, and the first region SD1 may be closer to the floating diffusion node FD than the second region SD2. The third transmission signal TG3 having the voltage level $V_{TG3}(1)$ lower than the voltage level $V_{TG3}(0)$ may be applied to the gate of the third transmission transistor TX3, such that the photo charges TC can be stably stored in the first region SD1 disposed relatively closer to the floating diffusion node FD.

Figure 12A:
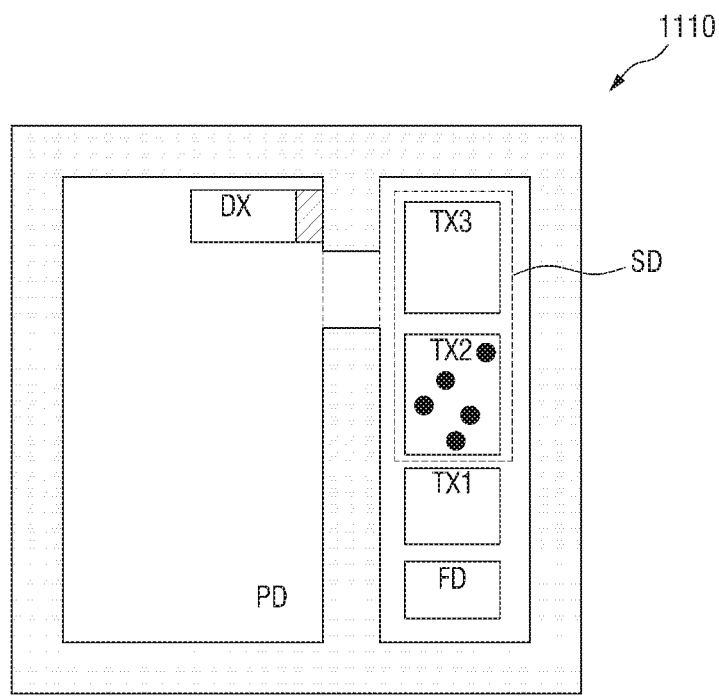
Figure 12B:
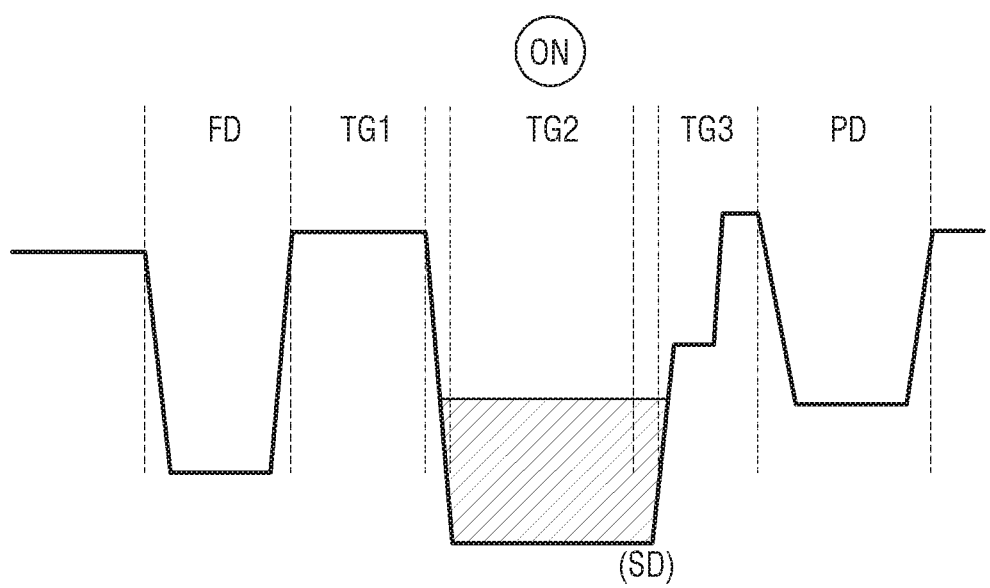

Referring to FIG. 8 and FIGS. 12A and 12B, the third transmission signal TG3 applied to the third transmission transistor TX3 may not be applied from the sixth time t6 to a seventh time t7. In other words, the third transmission transistor TX3 may be switched to a turn-off state. Accordingly, the photo charges TC may be stored in the first region SD1 of the storage diode SD.

Figure 13A:
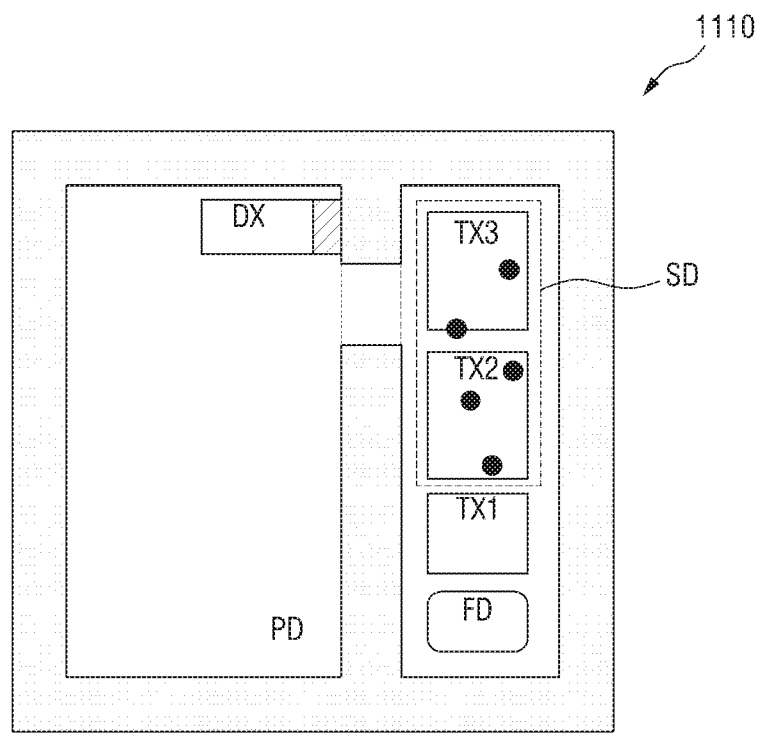
Figure 13B:
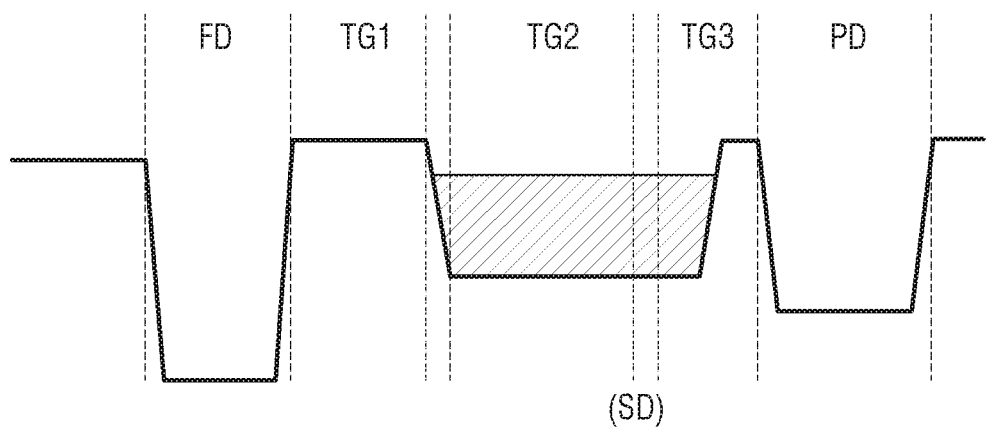

Referring to FIG. 8 and FIGS. 13A and 13B, the second and third transmission transistors TX2 and TX3 may be turned off from the seventh time t7 to an eighth time t8. In other words, after the photo charges TC are transmitted from the photo diode PD to the storage diode SD, the gate voltages applied to the second and third transmission transistors TX2 and TX3 may not be provided, and the photo charges TC may remain stored in the storage diode SD.

Figure 14A:
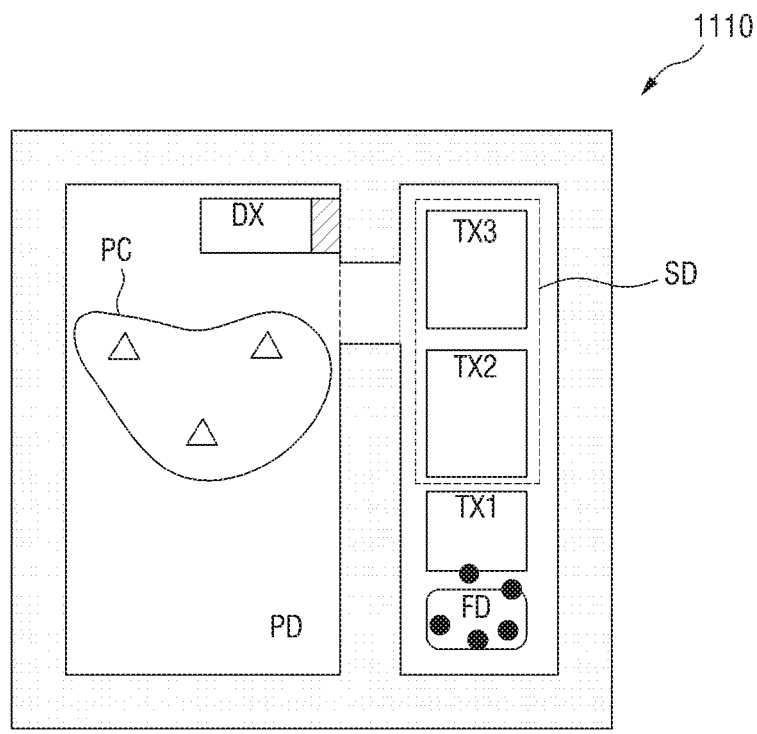
Figure 14B:
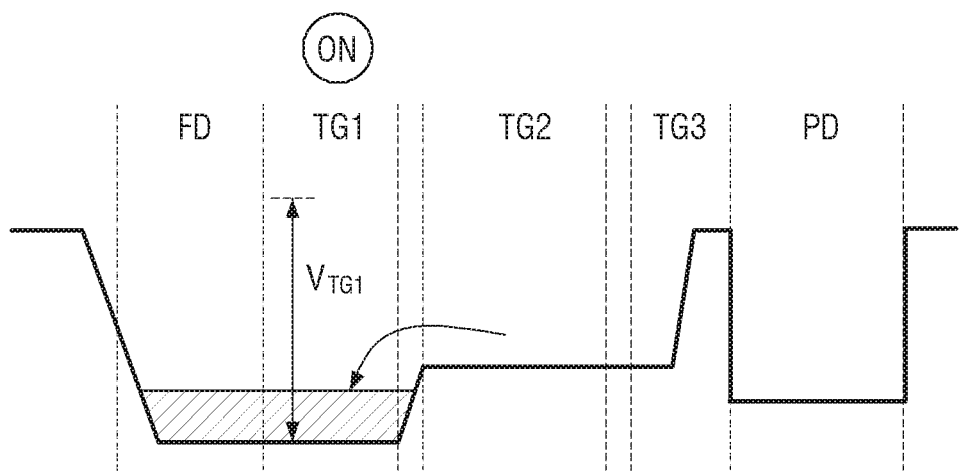

Referring to FIG. 8 and FIGS. 14A and 14B, the photo charges TC stored in the storage diode SD may be transmitted to the floating diffusion node FD from the eighth time t8 to a ninth time t9. For example, the first transmission signal TG1 having a voltage level $V_{TG1}$ may be applied to the gate of the first transmission transistor TX1 at the eighth time t8. Accordingly, the first transmission transistor TX1 may be turned on, and the photo charges TC stored in the storage diode SD may be transmitted to the floating diffusion node FD. FIG. 8 illustrates that the second reset transistor RX2 is turned off at the eighth time t8. However, the inventive concept is not limited thereto, and the second reset transistor RX2 may be turned on before the eighth time t8.

At the eighth time t8, the discharge signal DG having a voltage level $V_{DG}(1)$ may be applied to the gate of the discharge transistor DX, and accordingly, the discharge transistor DX may be turned on. As such, the parasitic charge PC generated in the photo diode PD may be discharged to a drain region of the discharge transistor DX through the discharge transistor DX. According to an exemplary embodiment of the inventive concept, in the process of transmitting the photo charges TC from the storage diode SD to the floating diffusion node FD, the discharge transistor DX may be turned on, and the parasitic charge PC generated in the photo diode PD may not be transmitted to the storage diode SD and may be discharged to the drain of the discharge transistor DX, such that a noise of an image, e.g., an image based on the photo charges TC, can be minimized.

Figure 15A:
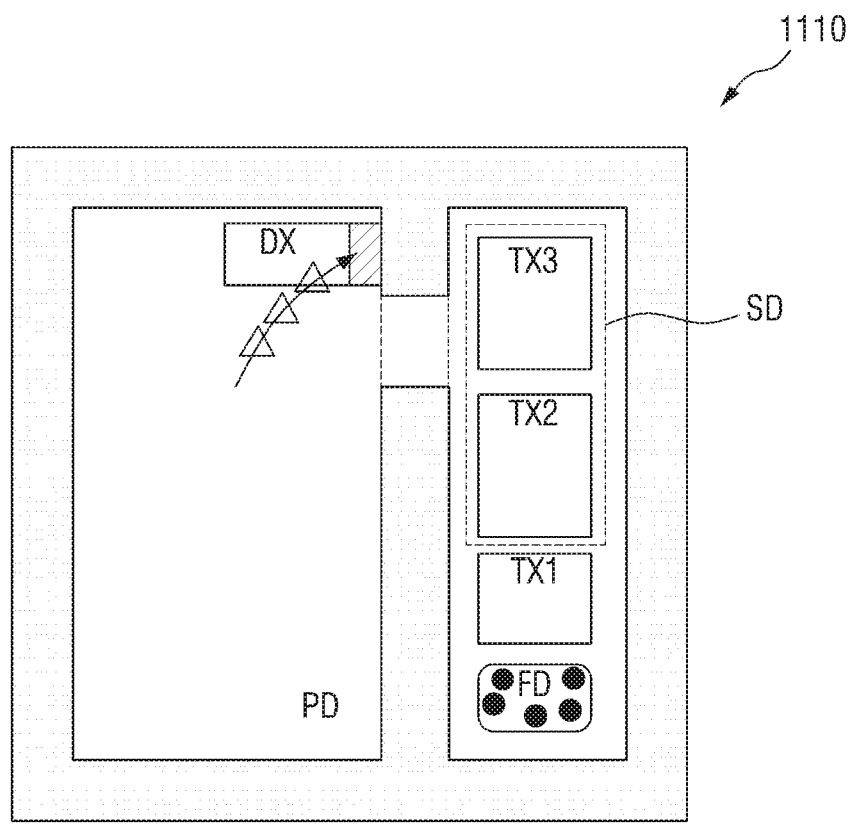
Figure 15B:
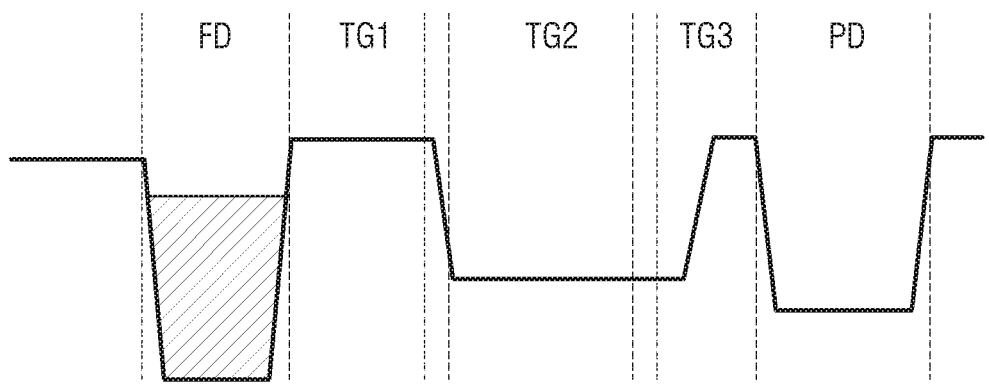

Referring to FIG. 8 and FIGS. 15A and 15B, the first transmission transistor TX1 and the discharge transistor DX may be turned off after the ninth time t9. In other words, the photo charges TC may have been moved to the floating diffusion node FD, and the parasitic charge PC, generated in the photo diode PD in the process of transmitting the photo charges TC from the storage diode SD to the floating diffusion node FD, may have been discharged to the drain region of the discharge transistor DX. Thereafter, the detection signal DET may be outputted based on the photo charges TC transmitted to the floating diffusion node FD and may be inputted to the comparison circuit 1130 as an input.

Figure 16:
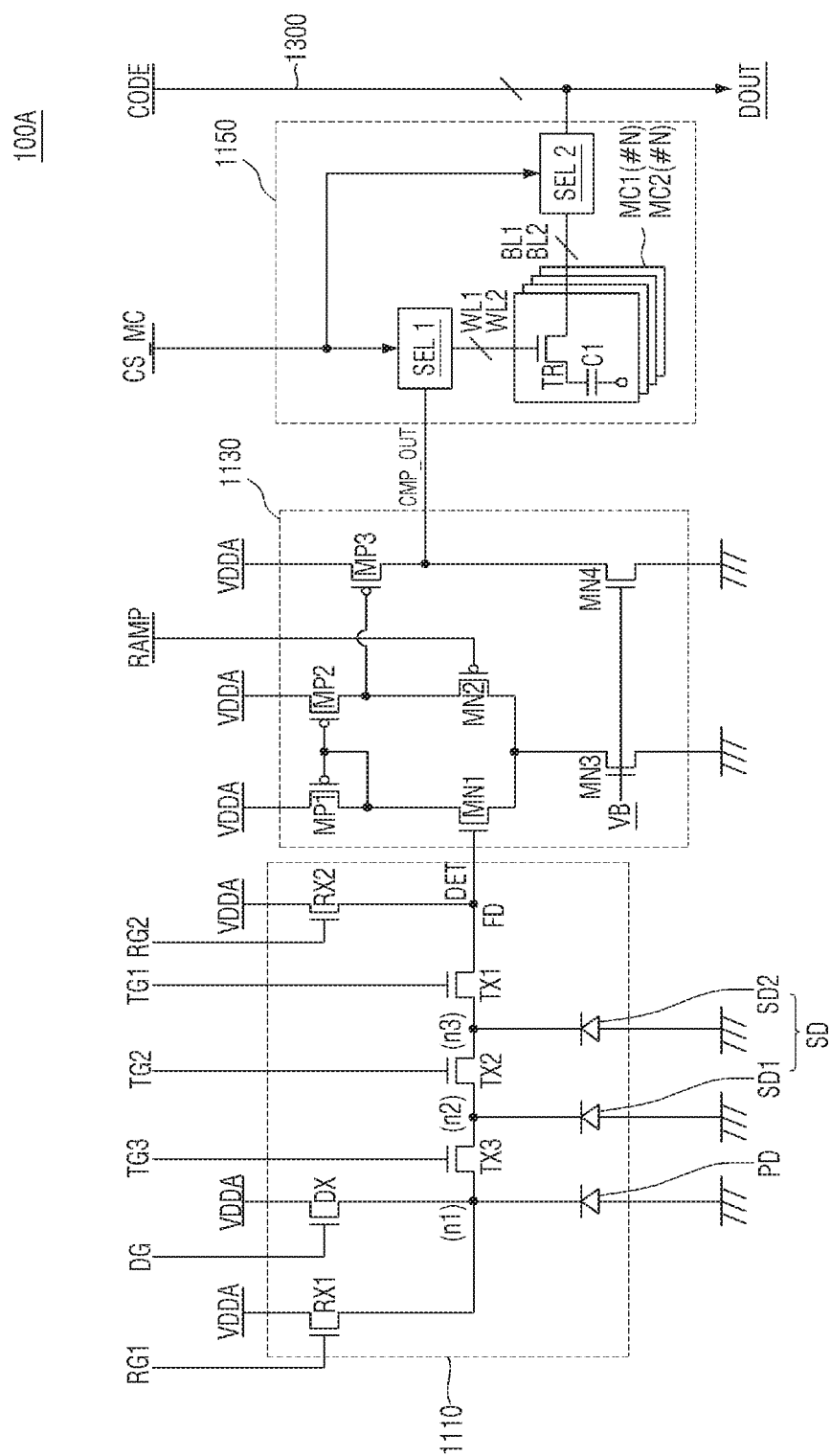
FIG. 16 is a circuit diagram provided to explain a digital pixel according to an exemplary embodiment of the inventive concept.
Figure 17:
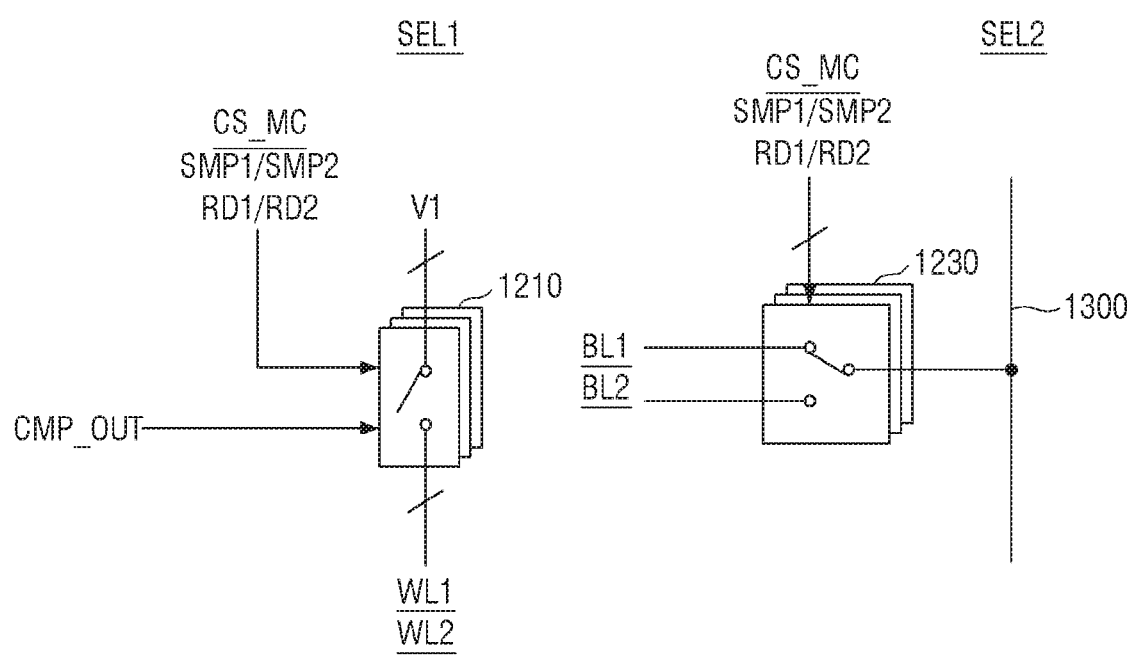
FIG. 17 is a view illustrating the digital pixel of FIG. 16 according to an exemplary embodiment of the inventive concept.

FIG. 16 is a circuit diagram provided to explain a digital pixel according to an exemplary embodiment of the inventive concept, and FIG. 17 is a view illustrating the digital pixel of FIG. 16 according to an exemplary embodiment of the inventive concept. Hereinafter, a redundant explanation of the configuration and the operation of the optical signal detector 1110 described with reference to FIG. 4 will be omitted.

Referring to FIG. 16, in an image sensor 100A, the comparison circuit 1130 may include transistors MN1-MN4 and MP1-MP3. Gates of the transistors MN1 and MN2 may be input terminals of the comparison circuit 1130 which is a differential amplifier and may receive the detection signal DET and the ramp signal RAMP. Sources of the transistors MN1 and MN2 may be electrically connected with each other, and may be biased by the transistor MN3 which is a current source. A gate of the transistor MN3 may be connected with the bias voltage VB, and a bias current may flow through the transistor MN3 according to the bias voltage VB.

The transistor MP1 may be connected between the power voltage VDDA and the drain of the transistor MN1. The transistor MP2 may be connected between the power voltage VDDA and the drain of the transistor MN2. For example, the power voltage VDDA supplied to the comparison circuit 1130 may be an analog voltage, and may be different from digital power voltage(s) supplied to other elements MC1, MC2, SEL1, etc. The drain of the transistor MP1 may be connected to the drain of the transistor MN1. The drain of the transistor MN1, the gate and the drain of the transistor MP1, and the gate of the transistor MP2 may be connected with one another. The transistors MP1 and MP2 may constitute a current mirror load.

The transistors MN1, MN2, MN3, MP1, and MP2 may amplify a difference between the voltage level VFD of the floating diffusion node FD and the voltage level VRAMP of the ramp signal RAMP. Voltage levels of the drains of the transistors MN2 and MP2 may be determined according to the voltage level VFD and the voltage level VRAMP of the ramp signal RAMP. The gate of the transistor MP3 may receive voltage levels of the drains of the transistors MN2 and MP2. The transistor MN4 may operate similarly to the transistor MN3. The transistors MN4 and MP3 may generate the comparison signal CMP_OUT by reversing the voltage levels of the drains of the transistors MN2 and MP2, similarly to an inverter. For example, when the voltage level VRAMP of the ramp signal RAMP is higher than the voltage level VFD of the floating diffusion node FD, the level of the comparison signal CMP_OUT may be the power voltage VDDA corresponding to logic high (for example, "1"). When the voltage level VRAMP of the ramp signal RAMP reaches the voltage level VFD of the floating diffusion node FD or becomes lower than the voltage level VFD of the floating diffusion node FD, the level of the comparison signal CMP_OUT may be switched from the power voltage VDDA to a power voltage GND corresponding to logic low (for example, "0").

The types (P-type, N-type) of the above-described transistors MN1-MN4 and MP1-MP3, and the voltage (logic) levels of the comparison signal CMP_OUT according to the voltage levels VRAMP and VFD are merely examples. According to an exemplary embodiment of the inventive concept, when a result of comparing the voltage level VRAMP of the ramp signal RAMP and the voltage level VFD of the floating diffusion node FD is changed, the level of the comparison signal CMP_OUT may also be changed. The number of the transistors constituting the comparison circuit 1130 is not limited to that illustrated in FIG. 16 and may be implemented differently.

The memory circuit 1150 may operate in response to the comparison signal CMP_OUT and the memory control signal CS_MC. The memory circuit 1150 may include a first selection circuit SEL1, a second selection circuit SEL2, a first memory cell MC1, and a second memory cell MC2. The memory cell MC1 may store a reset counting value corresponding to a reset level of the detection signal DET, and the memory cell MC2 may store a signal counting value corresponding to a signal level of the detection signal DET.

Each of the first and second memory cells MC1 and MC2 may be a dynamic random access memory (DRAM) cell 1T-1C including a transistor TR and a capacitor C1. The transistor TR of the first memory cell MC1 may electrically connect a first bit line BL1 and the capacitor C1 according to a signal of a first word line WL1. The transistor TR of the second memory cell MC2 may electrically connect a second bit line BL2 and the capacitor C1 according to a signal of a second word line WL2. According to an exemplary embodiment of the inventive concept, each of the first and second memory cells MC1, MC2 may store 1 bit. The number of the first memory cells MC1 may be N (where N is a natural number), and the number of the second memory cells MC2 may be N. For example, the number of the first memory cells MC1, the number of the second memory cells MC2, and the number of the plurality of transmission lines 1300 may be N, e.g., may be the same. However, the number of the first memory cells MC1, the number of the second memory cells MC2, and the number of the plurality of transmission lines 1300 may be implemented to be different from one another.

Referring to FIG. 17, the first selection circuit SEL1 may control the first and second word lines WL1 and WL2 in response to the comparison signal CMP_OUT and the memory control signal CS_MC. The first selection circuit SEL1 may include the first switch 1210. Each of the first switches 1210 may provide a first voltage V1 to any one of the first word line WL1 and the second word line WL2 in response to the comparison signal CMP_OUT and the memory control signal CS_MC. The first voltage V1 may be a high voltage that turns on the respective transistors TR of the first and second memory cells MC1 and MC2.

The memory control signal CS_MC may include first and second sampling signals SMP1 and SMP2, and first and second readout signals RD1 and RD2. The first sampling signal SMP1 may be a signal for storing a reset sampling value in the first memory cell MC1, and the second sampling signal SMP2 may be a signal for storing a signal sampling value in the second memory cell MC2. The first readout signal RD1 may be a signal for outputting the reset sampling value stored in the first memory cell MC1 as output data DOUT (e.g., the digital pixel signal DOUT), and the second readout signal RD2 may be a signal for outputting the signal sampling value stored in the second memory cell MC2 as the output data DOUT. However, the memory control signal CS_MC for controlling the memory circuit 1150 may be variously changed.

When the level of the comparison signal CMP_OUT is switched while the first sampling signal SMP1 is being activated, the first switch 1210 may turn on the transistors TR of the first memory cell MC1 and select (activate) the first memory cell M1, and may turn off the transistors TR of the second memory cell MC2 and may avoid selecting the second memory cell MC2. The first switch 1210 may electrically connect the counter CNT and the plurality of transmission lines 1300 while the first sampling signal SMP1 is being activated. The first memory cell MC1 may store, as the reset sampling value, a value of the code CODE at the time when the level of the comparison signal CMP_OUT is switched while the first sampling signal SMP1 is being activated.

When the level of the comparison signal CMP_OUT is switched while the second sampling signal SMP2 is being activated, the first switch 1210 may turn on the transistors TR of the second memory cell MC2 and select the second memory cell MC2, and may turn off the transistors TR of the first memory cell MC1 and may avoid selecting the first memory cell MC1. The first switch 1210 may electrically connect the counter CNT and the plurality of transmission lines 1300 while the second sampling signal SMP2 is being activated. The second memory cell MC2 may store, as the signal sampling value, a value of the code CODE at the time when the level of the comparison signal CMP_OUT is switched while the second sampling signal SMP2 is being activated.

When the first readout signal RD1 is activated, the first selection circuit SEL1 may select the first memory cell MC1 and may avoid selecting the second memory cell MC2. When the second readout signal RD2 is activated, the first selection circuit SEL1 may select the second memory cell MC2 and may avoid selecting the first memory cell MC1. When the first or second read-out signal RD1 or RD2 is activated, the second switch 1230 may electrically connect the plurality of transmission lines 1300 and the sensing amplifier SA. The reset sampling value stored in the first memory cell MC1 may be outputted to the sensing amplifier SA. In addition, the signal sampling value stored in the second memory cell MC2 may be outputted to the sensing amplifier SA. When the counting values stored in the first and second memory cells MC1 and MC2 are outputted, the first and second memory cells M1 and MC2 may be selected by the first and second readout signals RD1 and RD2, respectively, regardless of the comparison signal CMP_OUT.

The second selection circuit SEL2 may include the second switch 1230 to electrically connect the plurality of transmission lines 1300 and one of the first bit line BL1 and the second bit line BL2 in response to the memory control signal CS_MC. The second switch 1230 may perform a switching operation between the first bit line BL1, the second bit line BL2, and the plurality of transmission lines 1300 in response to the memory control signal CS_MC (for example, SMP1, SMP2, RD1, and RD2).

When the first sampling signal SMP1 is activated, the second switch 1230 may connect the first bit line BL1 to the plurality of transmission lines 1300. The code CODE may be provided to the first memory cell MC1 through the plurality of transmission lines 1300, the second switch 1230, and the first bit line BL1. When the second sampling signal SMP2 is activated, the second switch 1230 may connect the second bit line BL2 to the plurality of transmission lines 1300. The code CODE may be provided to the second memory cell MC2 through the plurality of transmission lines 1300, the second switch 1230, and the second bit line BL2.

When the first readout signal RD1 is activated, the second switch 1230 may connect the first bit line BL1 to the plurality of transmission lines 1300. The reset sampling value stored in the first memory cell MC1 may be outputted as the output data DOUT through the plurality of transmission lines 1300. When the second readout signal RD2 is activated, the second switch 1230 may connect the second bit line BL2 to the plurality of transmission lines 1300. The signal sampling value stored in the second memory cell MC2 may be outputted as the output data DOUT through the plurality of transmission lines 1300.

According to an exemplary embodiment of the inventive concept, the first and second selection circuits SEL1 and SEL2 may control a plurality of memory cells included in other digital pixels configured to operate at substantially the same timing. In other words, at least two digital pixels of the plurality of digital pixels may be configured to share the first and second selection circuits SEL1 and SEL2 that are provided separately. In this case, the first and second selection circuits SEL1 and SEL2 may be omitted in the memory circuit of each of the at least two digital pixels.

According to an exemplary embodiment of the inventive concept, one end (drain) of each of the transistors TR of the plurality of first memory cells MC1 of the digital pixel 1100 may be connected with each of the plurality of transmission lines 1300. One end (drain) of each of the transistors TR of the second memory cells MC2 of the digital pixel 1100 may be connected with each of the plurality of transmission lines 1300. According to an exemplary embodiment of the inventive concept, the two memory cells MC1 and MC2 may be connected with every one of the plurality of transmission lines 1300. Only one of the two memory cells MC1, MC2 connected to one transmission line may be selected by the first selection circuit SEL1, and the other one may not be selected. According to an exemplary embodiment of the inventive concept, the digital pixel 1100 may not include the second selection circuit SEL2 unlike in the exemplary embodiment shown in FIG. 16.

Figure 18:
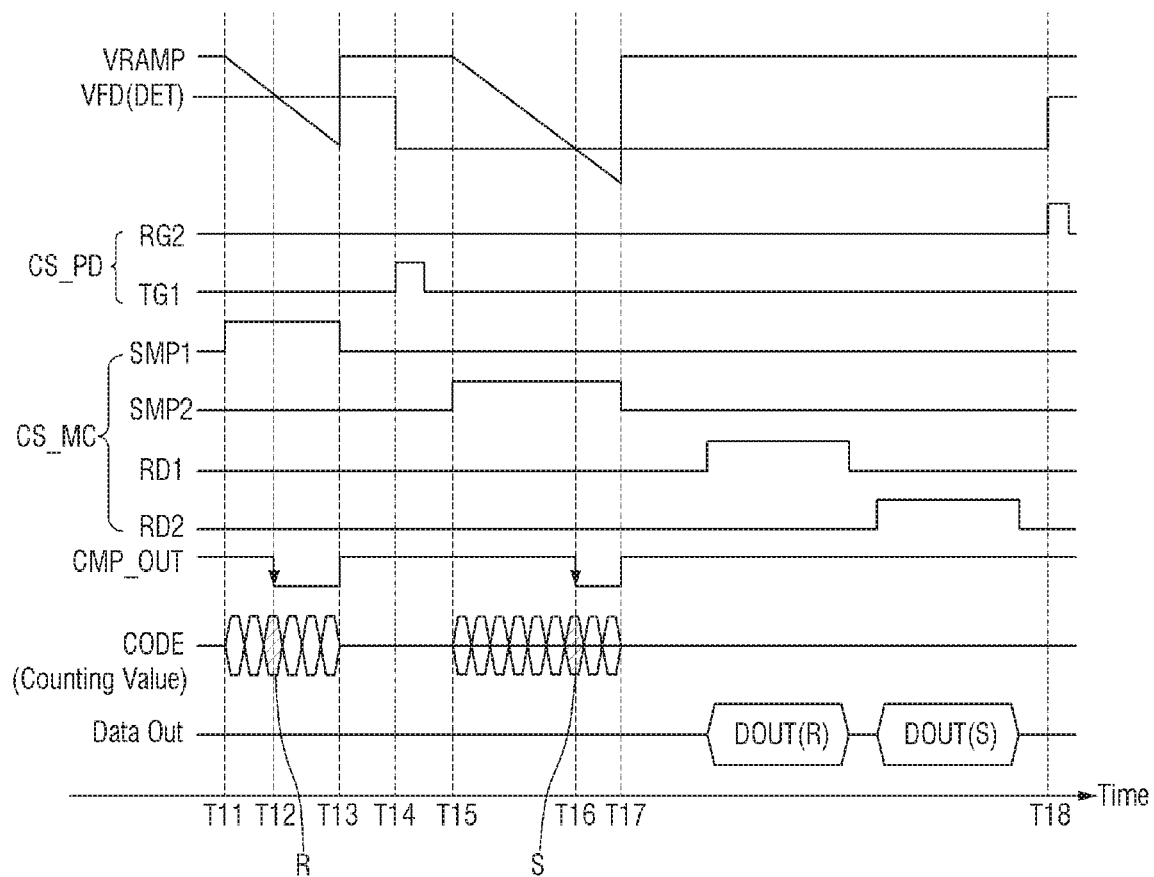
FIG. 18 is a timing chart provided to explain an operation of the digital pixel of FIG. 16 according to an exemplary embodiment of the inventive concept.

FIG. 18 is a timing chart provided to explain an operation of the digital pixel of FIG. 16 according to an exemplary embodiment of the inventive concept.

Before a 11th time T11, the photo diode PD, the storage diode SD, and the floating diffusion node FD may be reset, and the voltage level VFD of the detection signal DET may be set to a reset level. From the 11th time T11 to a 13th time T13, the voltage level VRAMP of the ramp signal RAMP may decrease (or increase) at a predetermined slope. The first sampling signal SMP1 may be activated from the 11th time T11 to the 13th time T13. The time during which the first sampling signal SMP1 is activated may correspond to a time during which the voltage level VRAMP decreases at the predetermined slope for the sake of reset level sampling. The voltage level VRAMP may start to be changed from the 11th time T11, and the counter CNT may initiate the counting operation from the 11th time T11. A counting value R of the code CODE may be in proportion (or inverse proportion) to the voltage level VRAMP which is changed with time and may correspond thereto.

At a 12th time T12, the voltage level VRAMP may reach the voltage level VFD, and, right after the 12th time T12, the voltage level VRAMP may be lower than the voltage level VFD. At the 12th time T12, the comparison signal CMP_OUT may be switched from logic high (or low) to logic low (or high). Respective bits of the counting value R of the code CODE, at the time T12 when the level of the comparison signal CMP_OUT is switched while the first sampling signal SMP1 is being activated, may be stored in the first memory cells MC1 as a reset counting value.

A time from the 11th time T11 to the 13th time T13 may be to detect a reset level of the optical signal detector 1110. At the 13th time T13, the voltage level VRAMP may be changed back to an initial (reset) level, and the voltage level of the comparison signal CMP_OUT may be changed back to an initial level.

At a 14th time T14, the first transmission signal TG1 may be activated for a predetermined time, and the first transmission transistor TX1 may be turned on to detect the signal level of the optical signal detector 1110. Accordingly, the photo charges TC stored in the storage diode SD may be provided to the floating diffusion node FD through the first transmission transistor TX1, and the voltage level VFD of the floating diffusion node FD may be changed from a reset level to a signal level.

The 14th time T14 may correspond to the 8th time t8 of FIG. 8. Accordingly, at the 14th time T14, the first transmission transistor TX1 may be turned on, and also, the discharge transistor DX may be turned on, such that the parasitic charge PC generated in the photo diode PD is not transmitted to the storage diode SD and is discharged to the drain of the discharge transistor DX.

According to an exemplary embodiment of the inventive concept, the 4th time t4 to 7th time t7 of FIG. 8 during which the second and third transmission transistors TX2 and TX3 are turned on and the photo charges TC accumulated in the photo diode PD are transmitted to the storage diode SD may be before the 14th time of FIG. 18.

From a 15th time T15 to a 17th time T17, the voltage level VRAMP may decrease at the predetermined slope to detect the signal level of the optical signal detector 1110. The second sampling signal SMP2 may be activated from the 15th time T15 to the 17th time T17. The time during which the second sampling signal SMP2 is activated may correspond to a time during which the voltage level VRAMP decreases at the predetermined slope for the sake of signal level sampling. The voltage level VRAMP may start to be changed from the 15th time T15, and the counter CNT may initiate a counting operation again from the 15th time T15.

At a 16th time T16, the voltage level VRAMP may reach the voltage level VFD, and, right after the 16th time T16, the voltage level VRAMP may be lower than the voltage level VFD. At the 16th time T16, the comparison signal CMP_OUT may be switched from logic high to logic low. Respective bits of a counting value S of the code CODE, at the time T16 when the level of the comparison signal CMP_OUT is switched while the second sampling signal SMP2, is being activated may be stored in the second memory cells MC2 as a signal counting value.

A time from the 15th time T15 to the 17th time T17 may be to detect the signal level of the optical signal detector 1110. At the 17th time T17, the voltage level VRAMP may be changed back to the initial level, and the level of the comparison signal CMP_OUT may be changed back to the initial level. The reset counting value and the signal counting value stored in the memory cells MC1 and MC2 may be read out, respectively, during the time from the 17th time T17 to an 18th time T18. The reset counting value stored in the first memory cells MC1 may be read out during a time when the first readout signal RD1 is being activated. The signal counting value stored in the second memory cells MC2 may be read out during a time when the second readout signal RD2 is being activated. The order of reading out is not limited to that illustrated in FIG. 18, and the plurality of transmission lines 1300 used for reading out the reset counting value, and the plurality of transmission lines 1300 used for reading out the signal counting value may be the same as each other and may be shared. The digital pixel 1100 may repeat the operations performed from the 11th time T11 to the 18th time T18.

Figure 19:
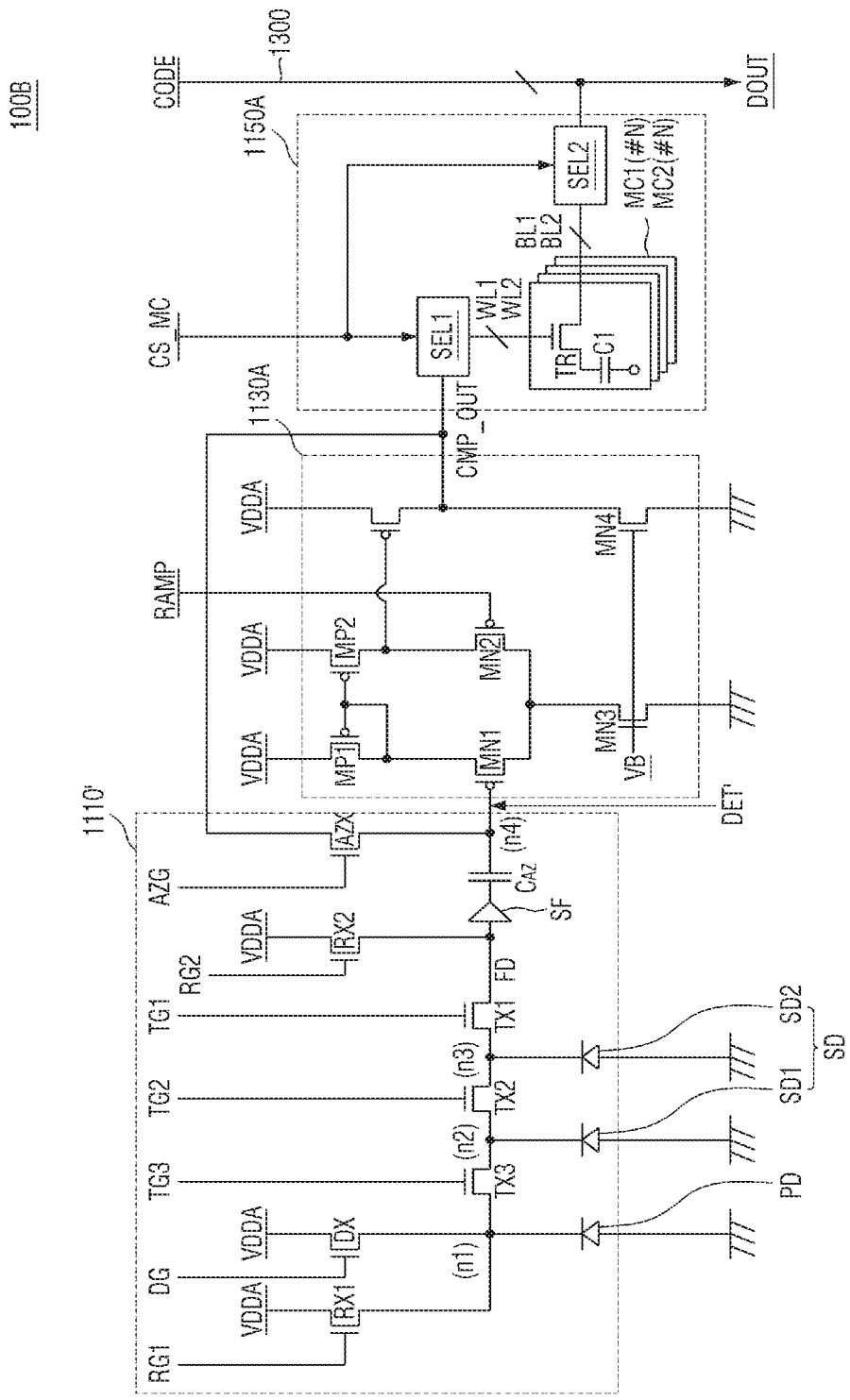
FIG. 19 is a circuit diagram provided to explain a digital pixel according to an exemplary embodiment of the inventive concept.

FIG. 19 is a circuit diagram provided to explain a digital pixel according to an exemplary embodiment of the inventive concept.

Referring to FIG. 19, in an image sensor 100B, an optical signal detector 1110' may further include a source follower SF and an auto zero transistor AZX. In addition, the optical signal detector 1110' may further include a capacitor $C_{AZ}$ connected between the floating diffusion node FD and a fourth node n4. The capacitor $C_{AZ}$ may be a passive element, a metal oxide semiconductor (MOS) transistor, a metal insulator metal (MIM) capacitor, a cell capacitor, or the like. The capacitor $C_{AZ}$ may be used to cancel an offset voltage due to a mismatch of the comparison circuit 1130, a difference in threshold voltages of the transistors, or a difference in geometry of the comparison circuit 1130. The auto zero transistor ACX of the optical signal detector 1110' may short-circuit the fourth node n4, which is an input terminal of the comparison circuit 1130, and an output terminal of the comparison circuit 1130 through which the comparison signal CMP_OUT is outputted, in response to an auto zero signal AZG. In this case, the auto zero signal AZG is applied to the gate of the auto zero transistor AZX, such that the auto zero transistor AZX is turned on, and accordingly, the comparison signal CMP_OUT is transmitted to the fourth node n4. An electric charge corresponding to an offset voltage of the comparison circuit 1130 may be stored in the capacitor $C_{AZ}$. Since the detection signal DET, in which the voltage of the capacitor $C_{AZ}$ is added to the voltage of the floating diffusion node FD, is inputted to the comparison circuit 1130, the offset voltage of the comparison circuit 1130 may be removed.

Figure 20:
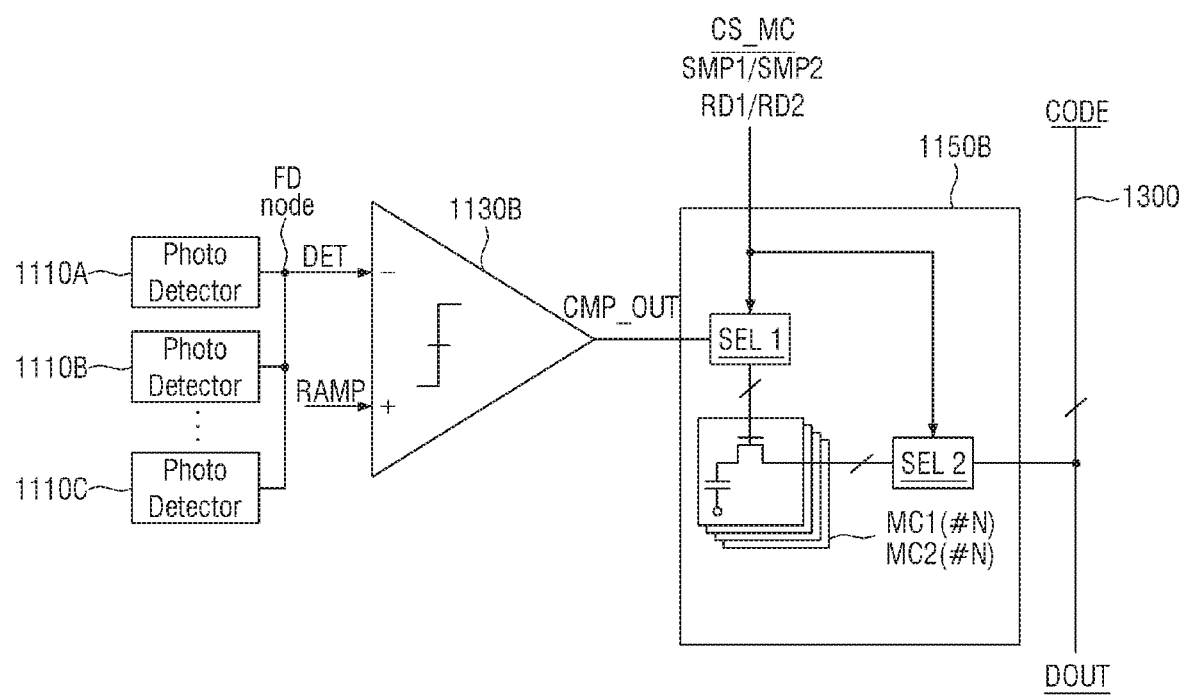
FIG. 20 is a view provided to explain a digital pixel array according to an exemplary embodiment of the inventive concept.

FIG. 20 is a view provided to explain a digital pixel array according to an exemplary embodiment of the inventive concept.

Referring to FIG. 20, the digital pixel 1100 according to an exemplary embodiment of the inventive concept may share one floating diffusion node FD and one comparison circuit 1130B. For example, the digital pixel 1100 may include M optical signal detectors 1110A, 1110B, . . . , 1110C, the comparison circuit 1130B, and a memory circuit 1150B. The memory circuit 1150B may include the first and second memory cells MC1 and MC2 each having N memory cells, the first selection circuit SEL1, and the second selection circuit SEL2. M is a natural number greater than or equal to 2. The plurality of optical signal detectors 1110A, 1110B, . . . , 1110C included in one digital pixel 1100 may include the same or different color filters.

According to an exemplary embodiment of the inventive concept, a reset counting value and a signal counting value of the optical signal detector 1110A may be stored in the memory cells MC1 and MC2, and the reset counting value and the signal counting value of the optical signal detector 1110A may be read out from the next memory cells MC1 and MC2. Similarly, a reset counting value and a signal counting value of the optical signal detector 1110B may be stored in the memory cells MC1 and MC2, and the reset counting value and the signal counting value of the optical signal detector 1110B may be read out from the next memory cells MC1 and MC2. In substantially the same way, the optical signal detectors including the last optical signal detector 1110C which is the M-th optical signal detector may perform similar operations to those of the optical signal detector 1110A and the optical signal detector 1110B.

According to an exemplary embodiment of the inventive concept, the optical signal detectors 1110A, 1110B, . . . , 1110C share the floating diffusion node FD, and accordingly, integration of the image sensor 100 can be enhanced.

While the inventive has been shown and described with reference to exemplary embodiments thereof, it will be apparent to those of ordinary skill in the art that many variations and modifications in form and details may be made thereto without substantially departing from the spirit and scope of the inventive concept as set forth by the appended claims.

What is claimed is:

1. A digital pixel comprising:
a photo diode connected to a first node and configured to generate an optical signal from an incident light;
a storage diode configured to store the optical signal in a second node;
a floating diffusion node configured to output a detection signal based on the optical signal;
a first transmission transistor connected between the first and second nodes, and configured to transmit the optical signal from the first node to the second node;
a second transmission transistor connected between the second node and the floating diffusion node, and configured to transmit the optical signal from the second node to the floating diffusion node;
a discharge transistor connected to the first node and configured to be turned on in a section in which the second transmission transistor is turned on to discharge a parasitic charge generated in the first node; and
a first reset transistor configured to reset the photo diode, and connected to the first node,
wherein the discharge transistor is gated with a first discharge voltage in a section in which the photo diode is reset by the first reset transistor, and is gated with a second discharge voltage in a section in which the second transmission transistor is turned on and transmits the optical signal from the second node to the floating diffusion node, and
wherein the second discharge voltage has a different level from that of the first discharge voltage.

2. The digital pixel of claim 1, wherein the storage diode comprises a first region and a second region, and
wherein the first transmission transistor comprises a first sub transmission transistor configured to transmit the optical signal from the first node to the first region, and a second sub transmission transistor configured to transmit the optical signal from the first region to the second region.

3. The digital pixel of claim 1, wherein the first discharge voltage has a higher level than that of the second discharge voltage.

4. The digital pixel of claim 1, further comprising a deep trench isolation (DTI) region formed on a lower portion of a channel through which an electric charge is transmitted between the photo diode and the storage diode.

5. The digital pixel of claim 4, wherein the DTI region is a back-side DTI (BDTI) having a trench formed on a rear surface of the photo diode toward a front surface of the photo diode.

6. The digital pixel of claim 1, further comprising a second reset transistor connected to the floating diffusion node and configured to reset the floating diffusion node.

7. The digital pixel of claim 1, further comprising a comparison circuit configured to compare the detection signal and a reference signal, and to output a comparison signal.

8. The digital pixel of claim 7, further comprising:
a source follower transistor connected with the floating diffusion node; and a capacitor connected between the source follower transistor and an input terminal of the comparison circuit.

9. The digital pixel of claim 7, further comprising:
at least one first memory cell configured to store a first counting value corresponding to a first voltage level of the detection signal based on the comparison signal, and to output the first counting value through a plurality of transmission lines; and
at least one second memory cell configured to store a second counting value corresponding to a second voltage level of the detection signal based on the comparison signal, and to output the second counting value through the plurality of transmission lines.

10. A digital pixel comprising:
an optical signal generator including a photo diode and configured to generate a first optical signal from an incident light in a first section;
an optical signal storage configured to receive the first optical signal from the optical signal generator and to store the first optical signal in a second section;
a detection signal outputter configured to receive the first optical signal from the optical signal storage, and to output a detection signal based on the first optical signal in a third section; and
a discharger including a discharge transistor, and configured to discharge a second optical signal generated from the optical signal generator in the third section,
wherein the discharge transistor is gated with a first discharge voltage in a section in which the photo diode is reset by a first reset transistor of the digital pixel, and is gated with a second discharge voltage in a section in which a transmission transistor of the digital pixel is turned on and transmits the first optical signal from a node storing the first optical signal to a floating diffusion node, and
wherein the second discharge voltage has a different level from that of the first discharge voltage.

11. The digital pixel of claim 10, wherein the optical signal generator, the optical signal storage, and the discharger comprise the photo diode, a storage diode, and the discharge transistor, respectively,
wherein the digital pixel further comprises:
a first transmission transistor configured to transmit the first optical signal from the optical signal generator to the optical signal storage in the second section; and
a second transmission transistor configured to transmit the first optical signal from the optical signal storage to the detection signal outputter in the third section.

12. The digital pixel of claim 11, wherein the first transmission transistor is configured to transmit the first optical signal to a first region of the storage diode, and
wherein the digital pixel further comprises a third transmission transistor configured to transmit the first optical signal from the first region to a second region of the storage diode in the second section.

13. The digital pixel of claim 12, wherein the third transmission transistor is gated with a voltage having a first level in a first sub section of the second section, and is gated with a voltage having a second level in a second sub section after the first sub section of the second section, and
wherein the first level is higher than the second level.

14. The digital pixel of claim 13, wherein the first reset transistor is configured to reset the photo diode, and
wherein the discharge transistor is gated with a voltage having a third level in a section in which the photo diode is reset by the first reset transistor, and is gated with a voltage having a fourth level in the third section, and
wherein the third level is higher than the fourth level.

15. The digital pixel of claim 14, further comprising a second reset transistor configured to reset the detection signal outputter.

16. The digital pixel of claim 15, wherein the second reset transistor is turned on at a same time as a starting time of the second section or at an earlier time, and is turned off at a same time as a starting time of the third section or at an earlier time.

17. An image sensor comprising:
a digital pixel array configured to sense an optical signal from an outside, and comprising a plurality of digital pixels each configured to output a digital pixel signal based on the optical signal;
a pixel driver configured to output a control signal for controlling the digital pixel array; and
a digital logic circuit configured to perform digital signal processing with respect to the digital pixel signal received from each of the plurality of digital pixels of the digital pixel array,
wherein each of the plurality of digital pixels comprises:
an optical signal generator including a photo diode and configured to generate a first optical signal from an incident light in a first section;
an optical signal storage configured to receive the first optical signal from the optical signal generator and to store the first optical signal in a second section;
a detection signal outputter configured to receive the first optical signal from the optical signal storage, and to output a detection signal based on the first optical signal in a third section; and
a discharger including a discharge transistor, and configured to discharge a second optical signal generated from the optical signal generator in the third section,
wherein, in each digital pixel of the plurality of pixels, the discharge transistor is gated with a first discharge voltage in a section in which the photo diode is reset by a first reset transistor, and is gated with a second discharge voltage in a section in which a transmission transistor is turned on and transmits the first optical signal from a node storing the first optical signal to a floating diffusion node, and
wherein the second discharge voltage has a different level from that of the first discharge voltage.

18. The image sensor of claim 17, wherein at least two digital pixels of the plurality of digital pixels share the detection signal outputter.

19. The image sensor of claim 17, wherein each of the plurality of digital pixels comprises:
a comparison circuit configured to compare the detection signal and a reference signal, and to output a comparison signal; and
a memory circuit configured to store the digital pixel signal which is a counting value of the detection signal based on the comparison signal, and to output the digital pixel signal through a plurality of transmission lines,
wherein the digital logic circuit comprises a sensing amplifier configured to sense the digital pixel signal of each of the plurality of digital pixels through the plurality of transmission lines.

* * * * *